(12) United States Patent
Mahdaviani et al.

(10) Patent No.: US 9,749,388 B2
(45) Date of Patent: Aug. 29, 2017

(54) NETWORK CODING USING AN OUTER CODING PROCESS

(71) Applicant: THE GOVERNORS OF THE UNIVERSITY OF ALBERTA, Edmonton (CA)

(72) Inventors: Kaveh Mahdaviani, Toronto (CA); Raman Yazdani, Irvine, CA (US); Masoud Ardakani, Edmonton (CA)

(73) Assignee: THE GOVERNORS OF THE UNIVERSITY OF ALBERTA, Edmonton, Alberta (CA)

( * ) Notice: Subject to any disclaimer, the term of this patent is extended or adjusted under 35 U.S.C. 154(b) by 686 days.

(21) Appl. No.: 14/308,261

(22) Filed: Jun. 18, 2014

(65) Prior Publication Data

US 2014/0379858 A1 Dec. 25, 2014

Related U.S. Application Data

(60) Provisional application No. 61/836,915, filed on Jun. 19, 2013.

(30) Foreign Application Priority Data

Jun. 19, 2013 (CA) .................................... 2820637

(51) Int. Cl.
*H04L 29/08* (2006.01)
*H03L 1/00* (2006.01)
(Continued)

(52) U.S. Cl.
CPC .......... *H04L 67/02* (2013.01); *H03M 13/033* (2013.01); *H03M 13/1108* (2013.01);
(Continued)

(58) Field of Classification Search
CPC ..... H04L 67/02; H04L 1/0041; H04L 1/0045; H04L 1/0057; H04L 1/0076;
(Continued)

(56) References Cited

U.S. PATENT DOCUMENTS 8,037,395 B2 * 10/2011 Katayama ......... H03M 13/1515
714/752
8,321,752 B1 * 11/2012 Yang .................. H03M 13/1102
714/757

(Continued)

OTHER PUBLICATIONS

Mahdaviani, Kaveh et al., "Gamma Codes: A Low-Overhead Linear-Complexity Network Coding Solution", 2012 International Symposium on Network Coding (NetCod).

(Continued)

*Primary Examiner* — Walter Divito
(74) *Attorney, Agent, or Firm* — Brion Raffoul

(57) ABSTRACT

Systems, methods, and devices for encoding and decoding data packets for transmission across a data network. To encode, data packets are first subjected to a an outer code process to result in outer coded packets. The outer coded packets are then divided into generations or groups of outer coded packets, each group or generation having an equal number of packets. Output packets are then created by forming random linear combinations of the outer coded packets from a specific generation or group of outer coded packets. The coefficients for the various elements of each linear combination is selected from a Galois field of values. To decode the incoming packets, enough packets are received until an iterative decoding process can be initiated.

13 Claims, 11 Drawing Sheets

(51) Int. Cl.
*H03M 13/03* (2006.01)
*H03M 13/11* (2006.01)
*H03M 13/29* (2006.01)
*H03M 13/37* (2006.01)
*H04L 1/00* (2006.01)

(52) U.S. Cl.
CPC ..... *H03M 13/2906* (2013.01); *H03M 13/373* (2013.01); *H03M 13/3761* (2013.01); *H04L 1/0041* (2013.01); *H04L 1/0045* (2013.01); *H04L 1/0057* (2013.01); *H04L 1/0076* (2013.01)

(58) Field of Classification Search
CPC ........... H03M 13/033; H03M 13/1108; H03M 13/2906; H03M 13/373; H03M 13/3761
See application file for complete search history.

(56) References Cited

U.S. PATENT DOCUMENTS 8,995,533 B2 * 3/2015 Chen .................. H03M 13/136
 375/240.25
9,270,414 B2 * 2/2016 Shokrollahi .......... H04L 1/0041

OTHER PUBLICATIONS

Mahdaviani, Kaveh et al., "Linear-Complexity Overhead-Optimized Random Linear Netowrk Codes", 2012 International Symposium on Network Coding (NetCod' 12), Cambridge, MA, USA.

* cited by examiner

NETWORK CODING USING AN OUTER CODING PROCESS

RELATED APPLICATIONS

This application is a non-provisional application which claims the benefit of U.S. Provisional Patent Application No. 61/836,915 filed Jun. 19, 2013.

TECHNICAL FIELD

The present invention relates to network coding of data packets. More specifically, the present invention relates to the network coding of data packets using multiple layers of data packet coding.

BACKGROUND OF THE INVENTION

Soon after the introduction of its basic concept, network coding was accepted as a promising technique for multicast and attracted a lot of attention in the research community. As opposed to conventional packet networks where intermediate nodes can only store and forward the incoming packets, in network coding the intermediate nodes can also combine the incoming packets to form (encode) an outgoing packet. Later, the idea of linearly combining the incoming packets was introduced and extended by using an algebraic approach. Also, by proposing random linear network coding (RLNC), network coding was later shown to be an attractive technique for multicast over networks with random topology.

In RLNC, the source node and all the other intermediate nodes of the network encode the data packets by forming random linear combinations of them. The receivers then wait to receive enough encoded packets, in other words enough linear combinations of the information packets, such that they can form a full rank system of linear equations. Each receiver can now decode the information packets by solving its received system of linear equations. It has been shown that by using RLNC with sufficiently large code alphabet q, it is possible to achieve zero reception overhead with failure probability arbitrary close to zero. The encoding complexity of RLNC for a block of K information packets each with s symbols is $O(Ks)$ operations per coded packet where the operations are done in $GF(q)$. The complexity of decoding then scales as $O(K^2+Ks)$ per information packet which becomes impractical when the block size K is moderate to large.

To reduce the decoding complexity of network coding, the idea of fragmenting the information packet blocks into distinct generations was proposed. This way, random linear combinations are formed only within each generation. This makes the final linear equation system solvable locally within each generation and thus sparse. This technique, however, requires a large number of control messages to be exchanged between the nodes to combat the problem of rare blocks and block reconciliation. To avoid this, a method called sparse RLNC (SRLNC) was proposed. This method uses a simple random schedule for selecting which generation to transmit at any time. This method reduces the encoding complexity to $O(gs)$ per coded packet and the decoding complexity to $O(g^2+gs)$ per information packet, where g denotes the number of information packets in each generation This complexity is practically feasible if s is not very large, making SRLNC an attractive solution for multicast. Unfortunately, the reception overhead under this scheme is affected by the curse of coupon collector phenomenon and thus even for very large alphabet size or number of information packets, the reception overhead does not vanish. In fact, the reception overhead grows with K as $O(\log K)$ for sufficiently large number of generations. Consequently, a trade-off is raised between reception overhead and complexity in SRLNC.

It should be noted that, for this document, the reception overhead is defined as the difference between the number of received packets required for successful decoding and the number of information packets divided by the number of information packets. As well, it should be noted that throughout this document, the discussion is limited to the case where all generations are of the same size.

In general, the large reception overhead in SRLNC comes from two sources. The first and major source comes from random scheduling, the fact that the receiver needs to keep listening to the network until it receives enough packets in each generation to be able to decode them. As a result, the number of received packets varies across different generations and to ensure that all generations have enough packets may require a large number of total received packets. In other words, assuming that generations are of size g, for all generations to become full rank, some generations will receive significantly more than g packets resulting in a large reception overhead. The second source of reception overhead is due to the possibility of receiving linearly dependent combinations of the packets which do not bring new information for the decoder. The probability of receiving these linearly dependant equations can be arbitrarily reduced by increasing the field size q of the code alphabet. Another solution proposed is to perform pre-coding using maximum rank distance codes which is quite effective even for very small field sizes.

Knowing that SRLNC is complexity-efficient, there have been several attempts to decrease their reception overhead. For this purpose, the idea of using an outer code is introduced. In this method, an outer code which is considered as a separate block is applied to SRLNC. At the receiver, the outer decoder waits for the recovery of $1-\delta$ fraction of the generations for some small predefined $\delta$ and then participates in the decoding to recover the remaining $\delta$ fraction of the generations. This method is capable of reducing the reception overhead to a constant, independent of K. However, this scheme is still wasteful in terms of the reception overhead since it ignores the received packets pertaining to the $\delta$ fraction of the generations. Furthermore, waiting to receive enough packets to recover $1-\delta$ fraction of the generations when $\delta$ is small leads to a high probability of receiving more than g packets in some generations. As a result, the reception overhead does not vanish even for infinite block lengths.

The idea of overlapping generations, where some packets are shared among generations, has been proposed. This overlap reduces the reception overhead of SRLNC since generations can help each other in the decoding process. Another overlapped SRLNC scheme called Random Annex codes proposes random sharing of the packets between any two generations.

It should be noted that the overlap between different generations in overlapped SRLNC can be seen as having a repetition outer code acting on the common packets from overlapping generations. Thus, overlapped SRLNC can be seen as a special case of SRLNC with outer code. In overlapped SRLNC, in contrast to separate outer coding, there is no need to wait for the recovery of a large fraction of the generations before the repetition outer code can participate in the decoding. This can potentially reduce the reception overhead compared to other schemes. This point of view then leads to the idea of allowing the outer code to participate in the decoding, but not limiting the outer code to a repetition code. This in turn generates a host of new questions. For example, a major question is how one can design an outer code which provides minimum reception overhead. To the best of our knowledge, no general analysis and design technique for SRLNC with an outer code exists in the literature. Previous analysis methods either assume specific network structures or specific coding schemes and thus cannot be used to design outer coded SRLNC in a general way.

It should be noted that, for this document, the only limitation on the outer code is that we consider the class of linear outer codes which choose their variable nodes uniformly at random. These are referred to as random linear outer codes. This limitation simplifies the analysis and design of optimal codes. As will be discussed below, despite the mentioned limitation, the optimal design achieves asymptotic overheads as small as 2%.

SUMMARY OF INVENTION

The present invention provides systems, methods, and devices for encoding and decoding data packets for transmission across a data network. To encode, data packets are first subjected to an outer code process to result in outer coded packets. The outer coded packets are then divided into generations or groups of outer coded packets, each group or generation having an equal number of packets. Output packets are then created by forming linear combinations of the outer coded packets from a specific generation or group of outer coded packets. The coefficients for the various elements of each linear combination are selected from a Galois field of values. To decode the incoming packets, enough packets are received until a full rank linear equation system for one of the generations or groups of outer coded packets is present. The equation system can then be solved using Gaussian elimination.

In a first aspect, the present invention provides a method for encoding data packets at a source node prior to transmission to a destination node by way of a computer network, the method comprising:
 a) applying by a processor a linear outer code process to a plurality of data packets to result in a plurality of outer coded packets;
 b) partitioning by a processor said plurality of outer coded packets to result in a plurality of groups of outer coded packets, each group of outer coded packets having an equal number of outer coded packets and each group of outer coded packets having at least 2 outer coded packets;
 c) producing by a processor a plurality of output packets from said groups of outer coded packets, each output packet being a linear combination of outer coded packets from a specific one of said groups of outer coded packets from step b), each output packet being associated with a generation index, said generation index being associated with said specific one of said groups of outer coded packets from step b), each output packet being associated with a specific coefficient vector having elements selected from a finite field, said elements of said specific coefficient vector being coefficients for said linear combination of outer coded packets for said output packet;

wherein
 each output packet is transmitted to said destination by way of said computer network along with said output packet's corresponding coefficient vector and said output packet's corresponding generation index.

In a second aspect, the present invention provides a method for decoding encoded data packets, the method comprising:
 a) receiving by a processor a plurality of encoded data packets, each data packet being previously encoded such that said data packet is associated with at least one group of data packets, each data packet being a linear combination of outer coded packets from a specific group of outer coded packets, said processor receiving enough encoded data packets to form at least one full rank linear equation system for at least one current group of data packets;
 b) recovering by said processor packets associated with said at least one current group of data packets having a full rank linear equation system, said recovering being accomplished by solving said full rank linear equation system, wherein, after each current group has had its associated packets recovered, said current group is transformed into a past group;
 c) determining by said processor which check nodes are connected to full rank linear equation systems associated with past groups of data packets;
 d) removing by said processor data packets connected to check nodes determined in step c) as being connected to full rank linear equation systems associated with past groups of data packets;
 e) determining by said processor if any degree-one check nodes exist, said degree-one check nodes being check nodes having a degree equal to one;
 f) updating by said processor linear equation systems for groups associated with degree-one check nodes by adding at least one linear equation to said linear equation systems, said at least one linear equation to be added being in terms of packets in said groups associated with degree-one check nodes;
 g) determining by said processor if any updated linear equation systems associated with current groups is a full rank linear equation system, said current groups being groups associated with degree-one check nodes;
 h) repeating steps a)-g) as necessary.

In a third aspect, the present invention provides non-transitory computer readable media having encoded thereon computer readable and computer executable instructions which, when executed, implements a method for encoding data packets at a source node prior to transmission to a destination node by way of a computer network, the method comprising:
 a) applying by a processor a linear outer code process to a plurality of data packets to result in a plurality of outer coded packets;
 b) partitioning by a processor said plurality of outer coded packets to result in a plurality of groups of outer coded packets, each group of outer coded packets having an equal number of outer coded packets and each group of outer coded packets having at least 2 outer coded packets;
 c) producing by a processor a plurality of output packets from said groups of outer coded packets, each output packet being a linear combination of outer coded packets from a specific one of said groups of outer coded packets from step b), each output packet being associated with a generation index, said generation index being associated with said specific one of said groups of outer coded packets from step b), each output packet being associated with a specific coefficient vector having elements selected from a finite field, said elements of said specific coefficient vector being coefficients for said linear combination of outer coded packets for said output packet;

wherein each output packet is transmitted to said destination by way of said computer network along with said output packet's corresponding coefficient vector and said output packet's corresponding generation index.

In a further aspect of the invention, the present invention provides a method for decoding encoded data packets, the method comprising:

a) receiving by a processor a plurality of encoded data packets, each data packet being previously encoded such that said data packet is associated with at least one group of data packets, each data packet being a linear combination of outer coded packets from a specific group of outer coded packets;

b) determining by said processor if a specific condition has been satisfied, said specific condition relating to a linear equation system based on received packets;

c) in the event said specific condition has been satisfied, recovering by said processor contents of at least one outer coded packet;

d) reducing by said processor a degree of at least one check node associated with said group of data packets;

e) determining by said processor if any of said at least one check node associated with said group of data packets has a degree equal to one;

f) in the event at least one of said at least one check node associated with said group of data packets has a degree equal to one, updating by said processor linear equation systems for groups of packets associated with said at least one check node having a degree equal to one;

g) repeating steps a)-f) until an exit condition is satisfied.

BRIEF DESCRIPTION OF THE DRAWINGS

The embodiments of the present invention will now be described by reference to the following figures, in which identical reference numerals in different figures indicate identical elements and in which.

DETAILED DESCRIPTION OF THE INVENTION

Figure 1:
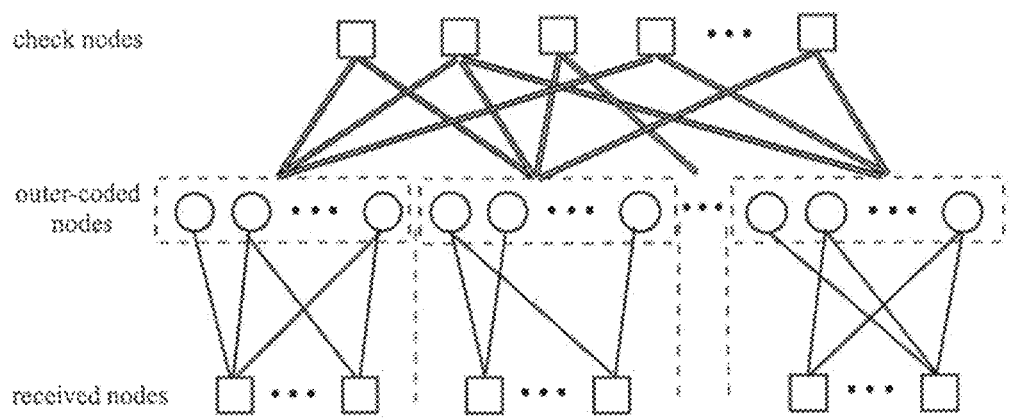
FIG. 1 is a graphical representation of a Gamma network code with various types of nodes, packets, and groups or generations.

In one aspect, the present invention provides a solution to the problem of designing low-overhead linear-complexity SRLNC with a random linear outer code. A new family of low-overhead linear-complexity network codes is introduced, called Gamma network codes. In Gamma network codes, SRLNC with outer code is considered in a more general way, i.e., the outer code is not limited to a simple repetition outer code. Also, Gamma network codes do not rely on a large portion of generations being recovered by the network code alone. We then develop an analytical framework to investigate the impact of the outer code parameters on the average reception overhead. The importance of such framework is that it can be used both for (i) finding the limits on the performance measures of SRLNC with random linear outer code such as the minimum achievable reception overhead, and (ii) to analytically design optimal codes.

It should be noted that the present invention differs from the prior art in that, unlike the prior art, where the outer code has to wait for a large fraction of the generations to be recovered, here the outer code can participate in the decoding as soon as a single generation is recovered. In other words, outer decoding is done jointly with solving the linear equation systems instead of separate decoding used in the prior art. Similarly, in contrast to the prior art, the received packets belonging to non-full rank generations are not ignored by the outer code in a Gamma network code. Also, in one aspect of the invention, the rate of the outer codes are much lower than those used in the prior art. Furthermore, design of the outer code in one aspect of the invention is motivated by Raptor codes and their ability to partially decode the block when the fraction of known packets is much smaller than the code rate. As will be shown below, the reception overhead of Gamma network codes is significantly smaller than that of the prior art.

Gamma network codes are built based on the following facts/results:

(1) Every received packet whose corresponding linear combination is linearly independent with those of all other received packets is innovative and must be used in the decoding process.

(2) Assuming the field size of the code alphabet is large enough, before receiving enough packets to form a small number of full-rank generations, all received packets are linearly independent with high probability.

(3) It is possible to design an outer code capable of successful decoding with small failure probability, based on receiving enough packets to have only a small fraction of full rank generations. Details of this code design is provided below.

One aspect of the present invention operates as follows. Accepting an optimally small reception overhead, packets are continuously received until a small fraction of the generations is full rank. Next, the carefully designed outer code successfully decodes all other generations through a joint decoding process with the network code. Since nearly all received packets are used in the decoding process, the outer code does not introduce an excess overhead. Provided below is an intermediate performance analysis of SRLNC with outer code.

In another aspect, the present invention introduces a new class of linear-complexity random linear network codes called Gamma network codes. This design is based on integrating a carefully designed outer code into SRLNC. The solution enables joint decoding of the outer and the SRLNC at the receivers and is shown to outperform other existing linear-complexity random linear network codes. Presented below is an asymptotic analysis of the decoding process of Gamma network codes. Using the asymptotic analysis, also presented is an optimization technique to design optimized Gamma network codes with very small reception overheads. Finite-length performance of these codes are also evaluated and some methods to improve their performance are presented. The results obtained with one aspect of the invention are compared with those of overlapping SRLNC schemes and other prior art schemes. As will be shown below, Gamma network codes are capable of significantly reducing the reception overhead compared to other existing linear-complexity random linear network coding schemes.

In the analysis provided below, it is assumed that the alphabet field size q is large enough to remove the reception overhead due to receiving packets with linearly dependent coefficient vectors. The assumption is primarily made to prevent unnecessary complications and to be consistent with the convention in the literature.

In terms of a network model, the discussion below considers the transmission of a file consisting of information or data packets from a source to a destination over a unicast link. The network structure is assumed to be dynamic with diverse routing, unknown and variable packet loss, and with random processing times at the intermediate nodes. It is further assumed that random linear combining is performed at the intermediate nodes on the available packets within each generation. As a result, the destination receives a random subset of the random linear combinations of the transmitted packets and is supposed to recover the information packets.

The encoding process of Gamma network codes is done in two steps. In the first step, a file consisting of information packets, each having d symbols in GF(q) is encoded via a linear outer code C of rate R giving rise to a block of N outer coded packets where R=K/N. These N outer coded packets are partitioned into $$n = \left\lceil \frac{N}{g} \right\rceil$$

distinct generations, where $\lceil x \rceil$ is the smallest integer larger than or equal to x. In this work, without loss of generality we assume that N is a multiple of g, where g denotes the equal number of packets in each generation. This division of the packets into different generations may also be termed as dividing the packets into various groups, with each group corresponding to a generation.

Referring to FIG. 1, provided is a graphical representation for a Gamma network code with check nodes, outer coded nodes, and received nodes corresponding to outer code's check equations, outer coded packets, and received packets, respectively. Each group of outer coded nodes constituting a generation is separated by a dashed box. The edges of the outer code's check nodes are hyper edges connecting dense linear combinations of the outer coded packets in the corresponding generation or group to the check node. The degree of an outer code's check nodes is defined as the number of generations connected to it. For example, the degree of the leftmost check node in FIG. 1 is 2.

The structure of the linear outer code C requires some explanation. FIG. 1 shows the graphical representation of a Gamma network code. As the figure shows, in contrast to the check nodes of a conventional linear code which represent parity-check equations imposed on the connected encoded packets, check nodes in C represent parity-check equations imposed on dense random linear combinations of the encoded packets of the connected generations. For example, the parity-check equation of the check node c is given by $$\sum_{i \in N(c)} \sum_{j=1}^{g} \alpha_j^{(i)} u_j^{(i)} = 0,$$

where N(c) denotes the set of generations connected to c, $\alpha$ are random coefficients from GF(q), and $u_j^{(i)}$ denotes the jth outer coded packets from the ith generation. For reasons explained below, the outer code C is characterized by a generating polynomial $$P(x) = \sum_{i=2}^{D} p_i x^i$$

where $p_i$ is the probability that a randomly selected check equation of an instance of the outer codes is connected to i generations. The minimum degree of P(x) is two since any check equation should encounter at least two generations, and $$\sum_{i=2}^{D} p_i = 1.$$

Moreover, generations contributing in each check equation are considered to be distributed uniformly at random among all the generations. We refer to such outer codes as random linear outer codes. More details about selecting R and designing P(x) are explained below.

As an aside, it should be noted that a linear combination is called dense when most of the coefficients are non-zero. When the coefficients are drawn uniformly at random from GF(q) the linear combination will be dense.

In the second step of the encoding, SRLNC is performed on the partitioned outer coded packets in which the source repeatedly forms output packets to be sent to the receiver through the network. In particular, first for each output packet a generation index $j \in \{1, 2, \ldots, n\}$ is selected uniformly at random with replacement. Then, having selected a vector element $\beta \in (GF(q))^g$ uniformly at random, an output packet is formed as the linear combination of the g outer coded packets of the jth generation using $\beta$ as the coefficient vector. Finally, the output packet is transmitted through the network along with the index of the selected generation j, and the coefficient vector $\beta$.

At the intermediate nodes, coding is done by conventional SRLNC. The complexity of encoding per output packet for Gamma network codes is $O(gs+\bar{d}gs(1-R)/R)$ at the source and $O(gs)$ at intermediate nodes, where $\bar{d}$ is the average degree of the outer code check nodes. This constant complexity per output packet thus gives rise to an overall linear encoding complexity in terms of the block length K.

At the receiver, each received packet reveals a linear equation in terms of the outer coded packets of the corresponding generation in GF(q). The receiver constantly receives packets until it can form a full rank linear equation system for one of the generations. This generation is then decoded by Gaussian elimination. At this time, an iterative decoding process operating on the graph of FIG. 1 initiates.

Each iteration of this iterative decoding process is performed in two steps. In the first step, the edge-deletion decoding step, all the nodes corresponding to the outer coded packets of the recent full rank generations and their connecting edges are removed from the decoding graph. As a result, the degree of the check nodes of the outer code is reduced. Any outer code's check node reduced to degree one represents a dense linear equation in terms of the outer coded packets of the connected generation in GF(q). Thus, a dense linear equation is added to the linear equation system of the corresponding generation.

The second step follows by updating the linear equation system of the generations and performing Gaussian elimination for the full-rank generations. Any added dense linear equation increases the rank of the linear equation system of that generation by one with high probability if the alphabet size q is large enough. As a result, there is a possibility that the updated generation becomes full rank and its packets could be recovered by Gaussian elimination.

The decoder now iterates between these two steps until either all the packets are recovered or no new packet could be recovered. If no new packet could be recovered, then the receiver receives more packets from the network so that it can resume the decoding. The decoding complexity of Gamma network codes is $O(g^2+gd+g\bar{d}(1-R)/R)$ operations per information packet which translates to a linear overall decoding complexity in terms of K.

Provided below is a study of the average performance of the Gamma network codes explained above. This study provides an analytical framework to formulate the effects of different code parameters on the average performance. This study is conducted under an asymptotic length assumption. Later, the finite-length performance of the example codes will be evaluated through computer simulations along with the related discussions and remarks on finite-length issues.

As stated above, a successful decoding requires all of the generations to become full rank. Any received packet and any outer code's check node reduced to degree one add one dense linear equation to the equation system of the corresponding generation. For large q, adding one dense linear equation increases the rank of equation system by one with high probability. Thus, to analyze the decoding process, one must track the evolution of the rank of the linear equation systems corresponding to different generations. To this end, in the following, one calculates the average fraction of generations whose equation systems are of rank $i, i \in \{0, \ldots, g\}$ at any step during decoding under the asymptotic length assumption.

Let the number of received encoded packets at some arbitrary state during the decoding be denoted by rn, where $0 \le r$ is the normalized number of received encoded packets. Having a total of r normalized number of received encoded packets, the decoder can form a system of linear equations in terms of the encoded packets in each generation. The rank of such an equation system will be referred to as the rank of its corresponding generation.

Let $R_{r,q}$ be a random variable whose value is equal to the rank of a generation selected uniformly at random, when the normalized number of received encoded packets is equal to r and the code alphabet is of size q. The following lemma gives the statistical structure of the generation rank distribution under very large q.

Lemma 1: (1)

$$q \to \infty \Rightarrow R_{r,q} \xrightarrow{D} B_{r,n},$$

where $\xrightarrow{D}$ denotes the convergence in distribution, and $B_{r,n}$ is a random variable with the following truncated binomial probability distribution:

$$Pr[B_{r,n} = i] = \begin{cases} \binom{m}{i}\left(\frac{1}{n}\right)^i\left(\frac{n-1}{n}\right)^{m-i} & i = 0, 1, \ldots, g-1 \\ 1 - I_{\frac{n-1}{n}}(m-g+1, g) & i = g \end{cases}.$$

Here $I_\alpha(m,l)$ is the regularized incomplete beta function defined as $$I_\alpha(m, \ell) = \binom{m+\ell-1}{\ell-1}\int_0^\alpha t^{m-1}(1-t)^{\ell-1} dt. \quad (2)$$

Note that although increasing the value of q increases the encoding/decoding complexity, it does not affect the complexity order per information bit. Therefore, as the main goal here is to study the average asymptotic performance, we assume that the value of q is large enough to make the results of the previous lemma valid.

Corollary 1

When the block length of the SRLNC goes to infinity, we have $n \to \infty$ and hence $$R_{r,q} \xrightarrow{D} R_r,$$

where $R_r$ is a random variable with the following truncated Poisson distribution $$Pr[R_r = i] = \begin{cases} \dfrac{e^{-r} r^i}{i!} & i = 0, 1, \ldots, g-1 \\ 1 - \dfrac{\Gamma_g(r)}{(g-1)!} & i = g \end{cases}, \quad (3)$$

In a further aspect, this document discloses a method for encoding data packets at a source node prior to transmission to a destination node by way of a computer network, the method comprising:

a) applying by a processor a linear outer code process to a plurality of data packets to result in a plurality of outer coded packets;

b) partitioning by a processor said plurality of outer coded packets to result in a plurality of groups of outer coded packets, each group of outer coded packets having an equal number of outer coded packets and each group of outer coded packets having at least 2 outer coded packets;

c) producing by a processor a plurality of output packets from said groups of outer coded packets, each output packet being a linear combination of outer coded packets from a specific one of said groups of outer coded packets from step b), each output packet being associated with a generation index, said generation index being associated with said specific one of said groups of outer coded packets from step b), each output packet being associated with a specific coefficient vector having elements selected from a finite field, said elements of said specific coefficient vector being coefficients for said linear combination of outer coded packets for said output packet;

wherein
each output packet is transmitted to said destination by way of said computer network along with said output packet's corresponding coefficient vector and said output packet's corresponding generation index.

In a further aspect, this document discloses a method for decoding encoded data packets, the method comprising:

a) receiving by a processor a plurality of encoded data packets, each data packet being previously encoded such that said data packet is associated with at least one group of data packets, each data packet being a linear combination of outer coded packets from a specific group of outer coded packets, said processor receiving enough encoded data packets to recover at least one outer coded packet by solving a linear equation system formed for a current group of data packets;

b) determining if all encoded packets have been recovered and terminating said method if all encoded packets have been recovered;

c) determining which check nodes are connected to past packets, said past packets being recently recovered packets;

d) removing data packets connected to check nodes connected to past packets;

e) recovering packets associated with degree-one check nodes, degree-one check nodes being check nodes having a degree equal to one;

f) updating linear equation systems for groups associated with degree-one check nodes by removing recovered packets from said linear equation systems;

g) solving linear equation systems which were updated in step f) to recover contents of packets associated with said linear equation systems.

In a further aspect, this document discloses a non-transitory computer readable media having encoded thereon computer readable and computer executable instructions which, when executed, implements a method for encoding data packets at a source node prior to transmission to a destination node by way of a computer network, the method comprising:

a) applying by a processor a linear outer code process to a plurality of data packets to result in a plurality of outer coded packets;

b) partitioning by a processor said plurality of outer coded packets to result in a plurality of groups of outer coded packets, each group of outer coded packets having an equal number of outer coded packets and each group of outer coded packets having at least 2 outer coded packets;

c) producing by a processor a plurality of output packets from said groups of outer coded packets, each output packet being a linear combination of outer coded packets from a specific one of said groups of outer coded packets from step b), each output packet being associated with a generation index, said generation index being associated with said specific one of said groups of outer coded packets from step b), each output packet being associated with a specific coefficient vector having elements selected from a finite field, said elements of said specific coefficient vector being coefficients for said linear combination of outer coded packets for said output packet;

wherein
each output packet is transmitted to said destination by way of said computer network along with said output packet's corresponding coefficient vector and said output packet's corresponding generation index.

In a further aspect, this document discloses a method for decoding encoded data packets, the method comprising:

a) receiving by a processor a plurality of encoded data packets, each data packet being previously encoded such that said data packet is associated with at least one group of data packets, each data packet being a linear combination of outer coded packets from a specific group of outer coded packets;

b) determining by said processor if a specific condition has been satisfied, said specific condition relating to a linear equation system based on received packets;

c) in the event said specific condition has been satisfied, recovering by said processor contents of at least one outer coded packet;

d) reducing by said processor a degree of at least one check node associated with said group of data packets;

e) determining by said processor if any of said at least one check node associated with said group of data packets has a degree equal to one;

f) in the event at least one of said at least one check node associated with said group of data packets has a degree equal to one, updating by said processor linear equation systems for groups of packets associated with said at least one check node having a degree equal to one;

g) repeating steps a)-f) until an exit condition is satisfied.

where $\Gamma_g(r)$ is the incomplete Gamma function given as $$\Gamma_\alpha(x) = (\alpha - 1)! e^{-x} \sum_{i=0}^{\alpha} \frac{x^i}{i!}. \tag{4}$$

It should be noted that Gamma network codes are named after the incomplete Gamma function since it plays a key role in their design.

Now that we have the probability distribution of the rank of a randomly selected generation at hand, we are interested to find the average number of generations of rank $i, i \in \{0, 1, \ldots, g\}$. The following lemma derives this quantity.

Lemma 2

Let $E_r\{\cdot\}$ denote the expectation operator given that the normalized number of received packets is r. The average number of generations of rank i is then given by $$E_r\{|\{G|\text{rank}(G)=i\}|\} = nPr[R_r=i], \tag{5}$$

where |A| denotes the cardinality of the set A.

In the next step of the analysis, the growth in the average fraction of full rank generations during the decoding process is studied, with the assumption that that the packet reception has stopped at some arbitrary time. Let $r_0$ denote the normalized number of received encoded packets at this time.

The decoder has two sets of equations which could be used for decoding, namely the set of equations corresponding to the received encoded packets and the set of check equations available due to the outer code. Since the main goal in the design of SRLNC is to keep the decoding and encoding efficient, Gaussian Elimination is just performed within each generation, i.e., just performed on the set of equations which are all in terms of packets belonging to a single generation. For the check equations of the outer code, the decoder uses message-passing decoding (i.e., edge-deletion decoding) to reduce these equations to degree one.

At step zero of the iterative decoding process, where the normalized number of received encoded packets is $r_0$, the probability distribution of the rank of any randomly selected generation is given by (3) as $$Pr[R_{r_0} = g] = 1 - \frac{\Gamma_g(r_0)}{(g-1)!}.$$

Therefore, the initial average fraction of full rank generations (i.e., before using any of the check equations in the decoding), is given by $$x_0 = 1 - \frac{\Gamma_g(r_0)}{(g-1)!}. \quad (6)$$

Having the developed mathematical framework at hand, it is now easy to track the average fraction of full rank generations as a function of the normalized number of received packets. In order to keep this simple formulation working for tracking the average fraction of full rank generations when the outer code comes to play in the decoding, we introduce the concept of effective number of received packets. The aim of this definition is to translate the effect of check equations which are reduced to degree one into the reception of some imaginary packets from the network. This enables the use of the developed mathematical framework to track the average fraction of full rank generations as the decoding iterates between the edge-deletion decoder working on the outer code and the Gaussian elimination decoder which as works inside each generation.

As a next step, it can be assumed that after the ith iteration of the decoding for some i≥0, we have a certain fraction $x_i$ of full rank generations. Moreover, let $y_i$ denote the number of check equations of the outer code reduced to degree one at iteration i, which have not been reduced to degree one up to the end of iteration i−1. Each of these check equations now represents a dense equation in terms of the packets of one of the non-full rank generations. When q is large enough, each of these equations will then increase the rank of its corresponding non-full rank generation by one, with high probability. However, as the selection of generations participating in each parity check equation in the outer code is done uniformly at random in the encoder, the effect of these equations on the decoding is equivalent to receive $y_i$ imaginary packets from the network all belonging to the non-full rank generations. Noticing that receiving more packets in the full rank generations also does not have any effect in the decoding process and does not change the fraction of full rank generations, we can easily model the effect of Y reduced degree-one parity check equations of the outer code by receiving $y_i/(1-x_i)$ imaginary packets from the network distributed uniformly at random over all the generations. We will refer to these $y_i/(1-x_i)$ imaginary packets as the effective number of received packets at the beginning of iteration i+1. Moreover, we refer to the quantity $$z_{i+1} = \Gamma_g^{-1}((1-x_i)(g-1)!) + y_i/(1-x_i),$$

as the total effective number of received packets at the beginning of iteration i+1. According to Lemma 2, and the discussion above, the average fraction of full rank generations at iteration i+1 is given by $$x_{i+1} = 1 - \frac{\Gamma_g\left(\frac{z_{i+1}}{n}\right)}{(g-1)!}.$$

Now consider the Tanner graph of the outer code. Similar to the idea of density evolution and the intrinsic information transfer (EXIT) charts, we track the density of full rank generations through the decoding iterations. In each iteration, in the first step all the edges connecting the full rank generations to the outer code's check nodes are removed. This reduces the degree of the check nodes. In the second step, each check node which is reduced to degree one adds a dense linear equation in terms of the packets of the connected generation to the coefficient matrix of that generation. The following theorem describes the evolution of the average fraction of full rank generations through the iterations of the decoding process.

Theorem 1

Let $r_0$ denote the normalized number of received packets, and $x_i$ for i≥0 denote the average fraction of full rank generations after iteration i of decoding. Then the average effective number of received packets at iteration i, i≥1 is given by $$ng(1-R)P'(x_{i-1})(1-x_i),$$

where P'(•) denotes the first order derivative of P(x) and we have $$x_0 = 1 - \frac{\Gamma_g(r_0)}{(g-1)!}, \quad (7)$$

$$x_i = 1 - \frac{\Gamma_g(r_0 + g(1-R)P'(x_{i-1}))}{(g-1)!}, \quad i \geq 1.$$

Proof.

The initial average fraction of full rank generations $x_0$, could be calculated using (6). In the first iteration of the decoding, decoder removes the edges connecting the full rank generations connected to the outer code's check nodes. Thus, the probability of having a randomly selected check node reduced to degree one at this point is equal to $$\sum_{i=2}^{\infty} p_i \binom{i}{1}(x_0)^{(i-1)}(1-x_0) = P'(x_0)(1-x_0).$$

This is the probability of all except one of the generations participating in that check equation being full rank, and having that last one belong to the set of non-full rank generations. Such a check equation now reveals a dense equation in terms of packets of the only non-full rank generation connected to it and hence increases the rank of that non-full rank generation with high probability. Thus, the probability that a randomly selected check equation increases the rank of a non-full rank generation in iteration 1 is $$P'(x_0)(1-x_0).$$

Moreover, as the total number of check equations is given by N−K, the average number of check equations which are now capable to increase the rank of a non-full rank generation is given as $$N(1-R)P'(x_0)(1-x_0) = ng(1-R)P'(x_0)(1-x_0).$$

As discussed above, the effect of these $ng(1-R)P'(x_0)(1-x_0)$ equations on the generation rank growth is equivalent to the effect of $ng(1-R)P'(x_0)$ dense equations distributed uniformly at random over all of the generations. Thus, we model the impact of iteration one of the edge-deletion by the reception of $ng(1-R)P'(x_0)$ dense equations distributed uniformly at random over all of the generations. Then the average effective number of equations is $ng(1-R)P'(x_0)$, or equivalently, the normalized average effective number of equations is $g(1-R)P'(x_0)$.

As all of the equations (i.e. effective check equations reduced to degree one, and equations corresponding to the received packets) which have been used in the coefficient matrices of the generations have a uniform distribution on the set of all generations, then the total average effective number of equations used throughout the decoding up to iteration one is equal to $r_0+g(1-R)P'(x_0)$. Hence, similar to the calculation of $x_0$, we can calculate $x_1$ as $$x_1 = 1 - \frac{\Gamma_g(r_0 + g(1-R)P'(x_0))}{(g-1)!}.$$

Assuming the claim of Theorem 1 holds for all iterations from zero to i, we will now prove the claim for iteration i+1, and using mathematical induction we then conclude that the theorem holds for all iterations. Recall that we denote the average fraction of full rank generations at the end of iteration i by $x_i$, and according to the assumption, the average effective normalized number of the total received packets up to the end of iteration i is $r_0+g(1-R)P'(x_{i-1})$. Hence, according to the discussion above, the average fraction of check equations reduced to degree one after the edge deletion phase of iteration i+1 is given by $P'(x_i)(1-x_i)$. Since we have a total of $N-K=N(1-R)$ check equations, the number of check equations reduced to degree one is $N(1-R)(1-x_i)P'(x_i)$. (8)

In order to calculate the average effective number of equations received at iteration i+1, we need to find the number of check nodes reduced to degree one at this iteration which have not been reduced to degree one in the previous iterations. Therefore, we need to deduct the average number of check nodes reduced to degree one up to the end of iteration i which are still of degree one from (8). Hence, the total average effective number of received packets at this point is given by $$nr_0 + ng(1-R)P'(x_{i-1}) + \frac{ng(1-R)}{(1-x_i)}\left[P'(x_i)(1-x_i) - P'(x_{i-1})\frac{(1-x_i)}{(1-x_{i-1})}\right] =$$

$$n[r_0 + g(1-R)P'(x_i)].$$

Therefore, the average fraction of full rank generations at the end of iteration i+1 is given by $$x_{i+1} = 1 - \frac{\Gamma_g(r_0 + g(1-R)P'(x_i))}{(g-1)!}.$$

The claim of the theorem then holds for all iterations.

Using Theorem 1, a sufficient condition for successful decoding can be derived. Assume that packet reception is stopped after receiving enough packets to form $x_0n$ full rank generations, for some $x_0$ such that $0<x_0<1$. For large enough q and n, the random linear outer code C with check degree distribution P(x) then asymptotically guarantees successful decoding if $$x < 1 - \frac{\Gamma_g(r_0 + g(1-R)P'(x))}{(g-1)!}, x \in (x_0, 1), \quad (9)$$

where $r_0 = \Gamma_g^{-1}((g-1)!(1-x_0))$.

Note that to recover all of the encoded packets, x should approach 1 in (9). But x tends to 1 when the argument of $\Gamma_g(\cdot)$ tends to infinity since $\Gamma_g(\cdot)$ is a strictly decreasing function lower bounded by zero. This means that P'(x) should tend to infinity as x tends to one. Since $x<1$ and P(x) is a polynomial with positive coefficients, this is achieved only when the average degree of the outer code check nodes $\bar{d}$ tends to infinity which makes the per packet encoding and decoding complexities unbounded.

Motivated by the construction of Raptor codes and to keep the complexities linear, we concatenate a high-rate linear block code C', which is called the pre-code, with the random linear outer code C. For this purpose, we use a weakened random linear outer code C of rate R with a small constant $\bar{d}$. A constant $\bar{d}$ means that a fraction of the generations will remain uncovered. The pre-code C' is then responsible to recover the remaining fraction of the generations. As a result, if we choose $\bar{d}$ and P(x) such that $$x < 1 - \frac{\Gamma_g(r_0 + g(1-R)P'(x))}{(g-1)!}, x \in (x_0, 1-\delta), \quad (10)$$

given a small $\delta>0$, then a capacity-achieving pre-code of rate $R'=1-\delta$ can recover the remaining $\delta$ fraction of generations.

Due to the concatenation of the pre-code, encoding of Gamma network codes should now be done in three steps. In the first step, a file consisting of K' packets is encoded via C' with rate R' to give a block of K=K'/R' packets. In the next step, encoding this block by the outer code C of rate R gives a block of N=K/R=ng outer coded packets. The final step consists of the conventional RLNC. The number of information packets is given by $K'=ngR'R=ng(1-\delta)R$. The receiver is able to successfully decode all of the information packets after receiving $r_0n$ encoded packets from the network. As a result, the average reception overhead of this coding scheme is given by $$\varepsilon = \frac{r_0 n - K'}{K'} \quad (11)$$

$$= \frac{r_0}{g(1-\delta)R} - 1$$

$$= \frac{\Gamma_g^{-1}((g-1)!(1-x_0))}{g(1-\delta)R} - 1$$

Considering these, the asymptotic convergence properties of Gamma network codes can be summarized as follows. For a Gamma network code with a linear random outer code of rate R and check degree distribution P(x), if (10) is satisfied for some $x_0$ and $\delta$, then the Gamma network code can asymptotically recover all of the information packets with an average reception overhead of (11) using a linear capacity-achieving pre-code of rate 1−δ. (Note that the pre-code can be a high-rate right-regular low-density parity-check code (LDPC) designed for the binary erasure channel (BEC).)

Moreover, in the asymptotic regime, the variance of the fraction of recovered generations approaches to zero. Hence, the average behavior is expected to be observed with high probability.

Figure 2:
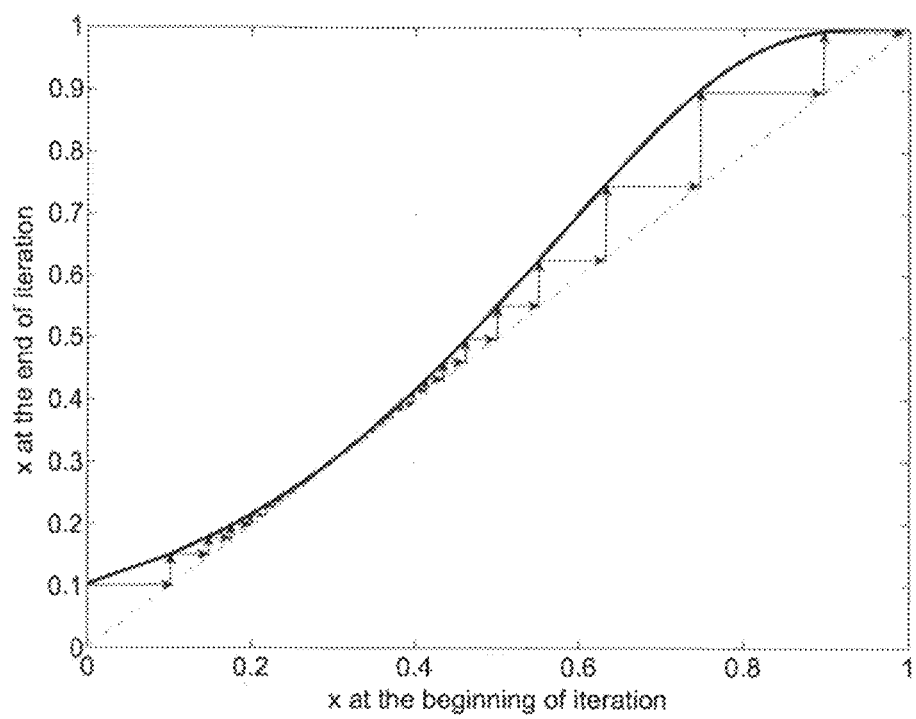
FIG. 2 is a decoding evolution chart for the Gamma network code with specific values.

An example of the above can be used for clarity. For a heuristic outer code design based on the assumption that minimizing the overhead can be achieved to a great extent by designing the code such that $x_0=1/n$ with $g=25$, we have $R=0.6351$ and $$P(x) = \sum_{i=2}^{D^*} \frac{1}{i(i-1)} x^i + \frac{1}{D^*} x^{(D^*+1)}, \quad (12)$$

where $D^*=33$. The evolution of $x_i$ during the decoding process is plotted in FIG. 2 for $x_0=0.10$. Also, the 45-degree line is plotted. We call this the decoding evolution chart. The point where the evolution chart gets closed, i.e., intersects the 45-degree line, is equal to 1−δ. As depicted in FIG. 2, 1−δ is very close to one for this example. The predicted average asymptotic reception overhead given by (11) is then 18.83%.

Referring to FIG. 2, the decoding evolution chart for the Gamma network code with the heuristic check degree distribution of the given example. Using these parameters, the lowest $x_0$ by which the evolution chart is open is $x_0=0.10$.

Previous section provided us with the tools for the asymptotic analysis of the decoding of Gamma network codes as well as their decoding convergence and reception overhead calculation. Now that this analytical formulation is at hand, we can use it to design good Gamma network codes. The goal of this design process is to find a combination of the parameters of the outer code and the pre-code, namely the rate of the outer code R, the check degree distribution P(x), and the rate of the pre-code R', which gives the minimum reception overhead.

For this purpose, we are seeking solution to the following optimization problem:

$$\min_{R, P(x), x_0, \delta} \varepsilon = \min_{R, P(x), x_0, \delta} \frac{\Gamma_g^{-1}((g-1)!(1-x_0))}{g(1-\delta)R} - 1 \quad (13)$$

subject to: (10) holds $$\sum_{i=2}^{D} p_i = 1 \quad 0 \leq p_i \leq 1.$$

Solving this optimization problem analytically is not easy since some of the parameters inherently depend on each other through the non-linear constraint (10). Thus, we use numerical methods to find solutions to this optimization problem.

First notice that for a fixed R and P(x), for any given $x_0$ one can find δ by using the convergence condition (10). Also, since $0 < x_0 < 1$ and $0 < R < 1$, for any fixed P(x) one can make a fine grid and do a search over $(x_0, R)$ and minimize ε and find the best combination of $x_0$, R, and δ. Finally, solution to (13) can be found by fixing maximum degree D and searching over P(x) and finding the best set of $x_0$, R, and δ for each P(x).

Searching over the space of P(x) can be done by global numerical optimization techniques. Here, to speed up the process, we use the gradient descent method to find various local minima and then choose the best answer. Our results are not guaranteed to be equal to the global minimum but as we will show in our examples, the decoding evolution chart for the optimized codes gets extremely close to the 45-degree line which states that our results should be very close to the global answer.

Assuming that the generation size is $g=25$, asymptotically optimized Gamma network codes are found for various values of the maximum check degree D by solving (13). The parameters of these codes are reported in Table 1. Selecting $D=2$ is equivalent to an all degree-2 check degree distribution. In this case, the check degree distribution is fixed and the rest of the parameters are optimized (code $C_1$ in the table). The reception overhead under this code is $\epsilon=11.43\%$. The evolution chart of the decoding of this code is plotted in FIG. 3.

| | $C_1$ | $C_2$ | $C_3$ | $C_4$ | $C_5$ | $C_6$ |
|---|---|---|---|---|---|---|
| D | 2 | 5 | 10 | 15 | 20 | 30 |
| $p_2$ | 1.0000 | 0.7860 | 0.8788 | 0.9226 | 0.9184 | 0.9162 |
| $p_3$ | | | | | 0.0011 | |
| $p_4$ | | | | 0.0004 | | 0.0004 |
| $p_5$ | | 0.2140 | | 0.0004 | | 0.0028 |
| $p_6$ | | | | | 0.0012 | 0.0069 |
| $p_7$ | | | | | 0.0071 | 0.0065 |
| $p_8$ | | | 0.0002 | | 0.0138 | 0.0090 |
| $p_9$ | | | 0.0003 | 0.0005 | 0.0082 | 0.0095 |
| $p_{10}$ | | | 0.1207 | 0.0010 | 0.0036 | 0.0075 |
| $p_{11}$ | | | | | 0.0005 | 0.0068 |
| $p_{12}$ | | | | | 0.0003 | 0.0055 |
| $p_{13}$ | | | | | | 0.0032 |
| $p_{14}$ | | | | 0.0048 | | |
| $p_{15}$ | | | | 0.0703 | | |
| $p_{19}$ | | | | | 0.0004 | |
| $p_{20}$ | | | | | 0.0455 | |
| $p_{26}$ | | | | | | 0.0007 |
| $p_{27}$ | | | | | | 0.0006 |
| $p_{28}$ | | | | | | 0.0002 |
| $p_{29}$ | | | | | | 0.0002 |
| $p_{30}$ | | | | | | 0.0239 |
| $x_0$ | 0.0490 | 0.1100 | 0.0885 | 0.0762 | 0.0782 | 0.0802 |
| R | 0.6600 | 0.7342 | 0.7228 | 0.7163 | 0.7192 | 0.7216 |
| 1 − δ | 0.9433 | 0.9746 | 0.9912 | 0.9910 | 0.9910 | 0.9911 |
| ε | 11.43% | 6.62% | 3.64% | 2.75% | 2.65% | 2.60% |

As evident from the results of Table 1, increasing D from 2 to 30 decreases the reception overhead from 11.43% to 2.60%. This is because increasing D allows larger average degrees for P(x) and hence the closing point of the evolution chart gets closer to $x=1$. Also, note that the reception overhead does not change significantly for D>15 since the closing point 1−δ is already very close to 1 and larger average degrees does not change 1−δ and hence the overhead significantly. The decoding evolution charts for $C_4$ and $C_6$ which are optimized under D=15 and D=30, respectively, are also depicted in FIG. 3.

Note that in the optimized degree distributions of Table 1, only check nodes of degree 2 and D have significant weights, with most of the weight on degree 2. Having a large weight on degree-2 check nodes is useful since it maximizes the participation of the outer code's check nodes. Degree-2 check nodes start to contribute early at the beginning of the decoding but since they provide low connectivity in the decoding graph, they fail to be useful eventually when the fraction of recovered packets grow. Low connectivity in the graph make some segments of the graph unrecoverable since the decoding process cannot spread to all segments. This leads to a significant increase in the reception overhead. As an example, in the all degree-2 code $C_1$, the outer code participates in the decoding sooner than the other codes with larger D (compare $x_0$=0.049 with the rest) but fails to contribute in the decoding when the fraction of full rank generations gets larger (by having a smaller 1−δ) and a lower rate pre-code is needed to finish the decoding. Large-degree check nodes, on the contrary to degree-2 check nodes, provide good coverage in the graph but cannot participate early in the decoding since the low fraction of recovered packets is unlikely to reduce them to degree one. Consequently, there should be a balance between degree 2 and higher degrees. This balance is usually achieved by putting a large weight on degree 2 and the rest of the weight on the largest allowed degree.

Figure 3:
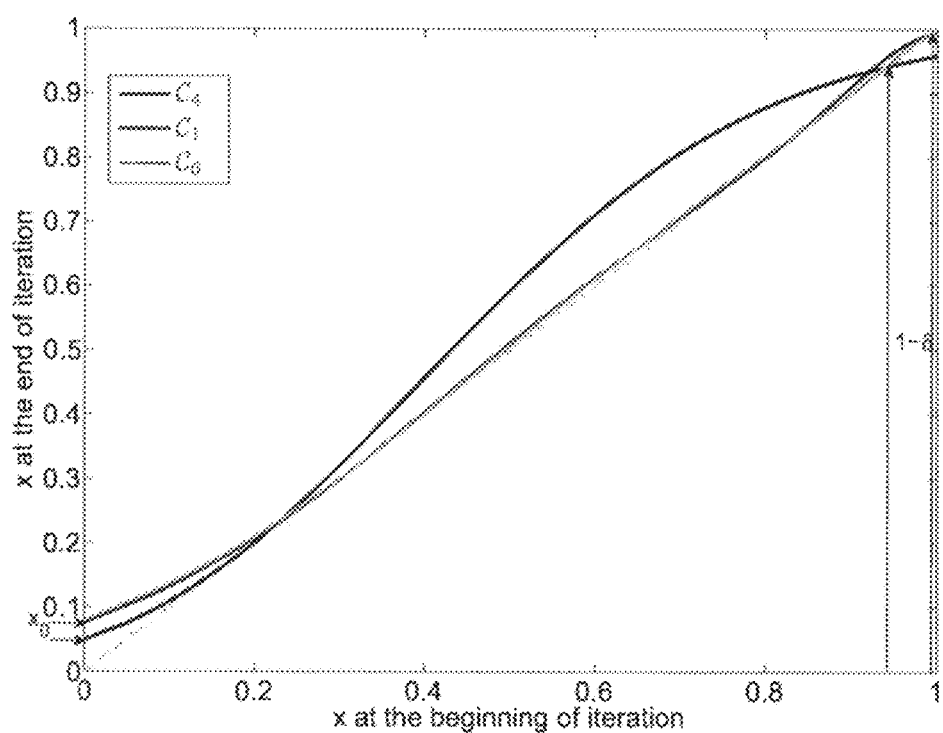
FIG. 3 is a decoding evolution chart for optimized Gamma network codes.

Referring to FIG. 3, the decoding evolution chart for the optimized Gamma network codes $C_1$, $C_4$, $C_6$ is presented. The parameters of these codes are reported in Table 1. Table 1 provides optimized check degree distributions $P(x)=\Sigma_i p_i x^i$ under g=25 for various maximum check degrees D.

The minimum reception overhead can be further decreased by increasing the generation size g. For example, reception overheads of $\epsilon$=2.17% and $\epsilon$=1.92% can be achieved under D=15 when g=50 and g=75, respectively ($C_7$ and $C_8$ in Table 2). This reduction in the minimum reception overhead is however achieved at the expense of added encoding and decoding complexities. It should be noted that the complexity still remains linear and only the coefficient increases. Table 2 provides optimized check degree distributions $P(x)=\Sigma_i p_i x^i$ under D=15 for generation sizes g=50 and g=75.

|          | $C_7$   | $C_8$   |
|----------|---------|---------|
| D        | 15      | 15      |
| $p_2$    | 0.9260  | 0.9303  |
| $p_3$    | 0.0007  |         |
| $p_5$    | 0.0002  | 0.0001  |
| $p_6$    | 0.0002  |         |
| $p_7$    | 0.0006  | 0.0005  |
| $p_8$    | 0.0010  | 0.0002  |
| $p_9$    | 0.0005  | 0.0003  |
| $p_{10}$ | 0.0001  |         |
| $p_{11}$ | 0.0001  | 0.0002  |
| $p_{12}$ | 0.0001  | 0.0002  |
| $p_{13}$ | 0.0018  |         |
| $p_{14}$ | 0.0018  | 0.0025  |
| $p_{15}$ | 0.0669  | 0.0658  |
| g        | 50      | 75      |
| $x_0$    | 0.0831  | 0.0853  |
| R        | 0.8008  | 0.8374  |
| 1 − δ    | 0.9911  | 0.9911  |
| $\epsilon$ | 2.17%  | 1.92%   |

Discussed below is the performance of practical Gamma network codes constructed based on the results of the previous section. In order to keep the results closer to a practical setting, we construct finite-length Gamma network codes and use binary alphabet for our simulations. We then investigate their reception overhead and failure probability trade-off and compare them with the other existing SRLNC with outer code schemes. It can be seen that Gamma network codes are capable of outperforming all the other schemes. We also discuss issues regarding their finite-length performance, provide robust improved designs, and present improved decoding algorithms for Gamma network codes with small alphabet sizes.

The setup for the simulation used for the performance assessment is as follows: The pre-code C' should be a capacity-achieving code such that it does not incur extra overhead. To this end, we use the right-regular capacity-achieving low-density parity-check (LDPC) codes designed for the binary erasure channel (BEC) as noted above. The check nodes of the pre-code, as opposed to the check nodes of the outer code, impose parity-check equations directly on the encoded packets. Decoding of the pre-code and the outer code is done jointly. As a result, during the decoding any pre-code check node reduced to degree one recovers a new coded packet. This updates the linear equation system for the generation to which the recovered packets belong by removing the new recovered coded packets from them. This reduces the linear equation system of those generations to the non-recovered packets. Since the number of unknowns are reduced, there is a possibility that the non-recovered packets of the updated generations can be recovered by Gaussian elimination. It is also worth mentioning that since the pre-code is a high-rate code, the degrees of its check nodes are usually very large. Thus, they are reduced to degree one and hence help the decoding process only at the final stages of the decoding when a large fraction of the coded packets are recovered.

Using a binary alphabet q=2 and having designed a pre-code C' of rate R', a random linear outer code C of rate R, and considering encoded packets block length of N=ng, where g is the generation size, we calculate the average reception overhead of the coding scheme by Monte Carlo simulation, i.e., $\bar{\epsilon}=E[(N_r-K')/K']$ where $N_r$ is the number of received packets required for successful decoding. To achieve the trade-off between decoding failure probability and overhead, we simulate the system for a large number of blocks and calculate the complementary cumulative distribution function of the overhead.

For a finite-length setup, we set the alphabet size q=2, generation size g=25, and the number of generations n=67, which gives an encoded packet block of N=1675 blocks. Using the parameters of the asymptotically optimized code $C_4$ from Table 1, we have R=0.7163 and K=RN=1198. As a result, N−K=477 check nodes are produced based on the optimized degree distribution P(x) in Table 1. For the pre-code, we use a right-regular LDPC code of rate R'=0.97. This rate is selected slightly lower than the asymptotically optimized rate of 0.991 due to the fact that there is a gap between the finite-length performance and asymptotic performance of capacity-achieving LDPC codes. (Note that, in practice, the best pre-code rate which gives the minimum reception overhead can be selected by using a Monte Carlo simulation.) The number of information packets will then be K'=1162. The average reception overhead achieved by Monte Carlo simulation is $\bar{\epsilon}$=21.37%. The decoding failure probability versus the reception overhead is plotted in FIG. 4.

Figure 4:
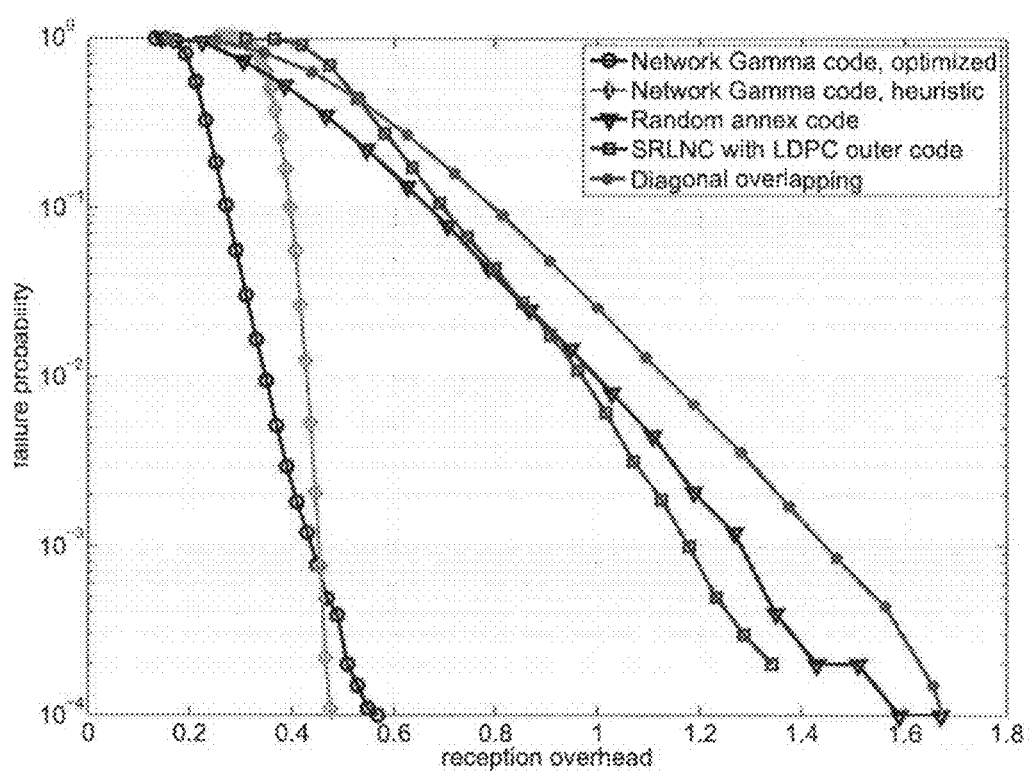
FIG. 4 is a graph comparing failure probability with reception overhead for different SRLNC schemes with outer code.

Referring to FIG. 4, a plot of failure probability versus reception overhead for different SRLNC schemes with outer code is presented. The encoded packet block length for all of these constructions is N=1675 packets with g=25. The average reception overheads of these schemes achieved by Monte Carlo simulation are reported in Table 3. It should be evident that the optimized Gamma network code outperforms all other schemes.

| Code              | $\bar{\epsilon}$ |
|-------------------|--------|
| SRLNC with LDPC   | 51.64% |
| Diagonal grid code | 48.59% |
| Random annex code | 39.44% |

| Code | $\bar{\epsilon}$ |
|---|---|
| Gamma network code, heuristic | 35.48% |
| Gamma network code, optimized | 21.37% |

We compare this code with the other existing linear-complexity SRLNC schemes in the prior art and also with an existing heuristic Gamma network code design. In the case of SRLNC with an outer LDPC code as a separate block, the optimal rate for N=1675 and g=25 is found by search at R=0.90 which gives rise to K=1508. For a prior art Random Annex code, the optimal annex size is reported to be 10 for this setting and this gives rise to K'=1000 packets and hence R=0.5970. For a prior art overlapping SRLNC scheme, we use a (67,25,40) diagonal grid code with angle θ=45° which is equivalent to having a repetition outer code of rate R=0.5970. For the heuristic design referred to above, the outer code rate is R=0.6153, D=33, P(x) is given by (12), and the pre-code is a right-regular capacity-achieving LDPC code of R'=0.97.

The average reception overhead achieved under these cases have been reported in Table 3. FIG. 4 also compares these schemes with our optimized Gamma network code in terms of failure probability-overhead trade-off. As evident from these results, the optimized Gamma network code outperforms all the other existing outer coded SRLNC schemes significantly. Furthermore, the optimized Gamma network code also outperforms the heuristically designed Gamma network code scheme.

Referring to Table 3, this table provides the average overhead for different linear-complexity SRLNC with outer code having the following parameters: N=1675, g=25, q=2.

Figure 5:
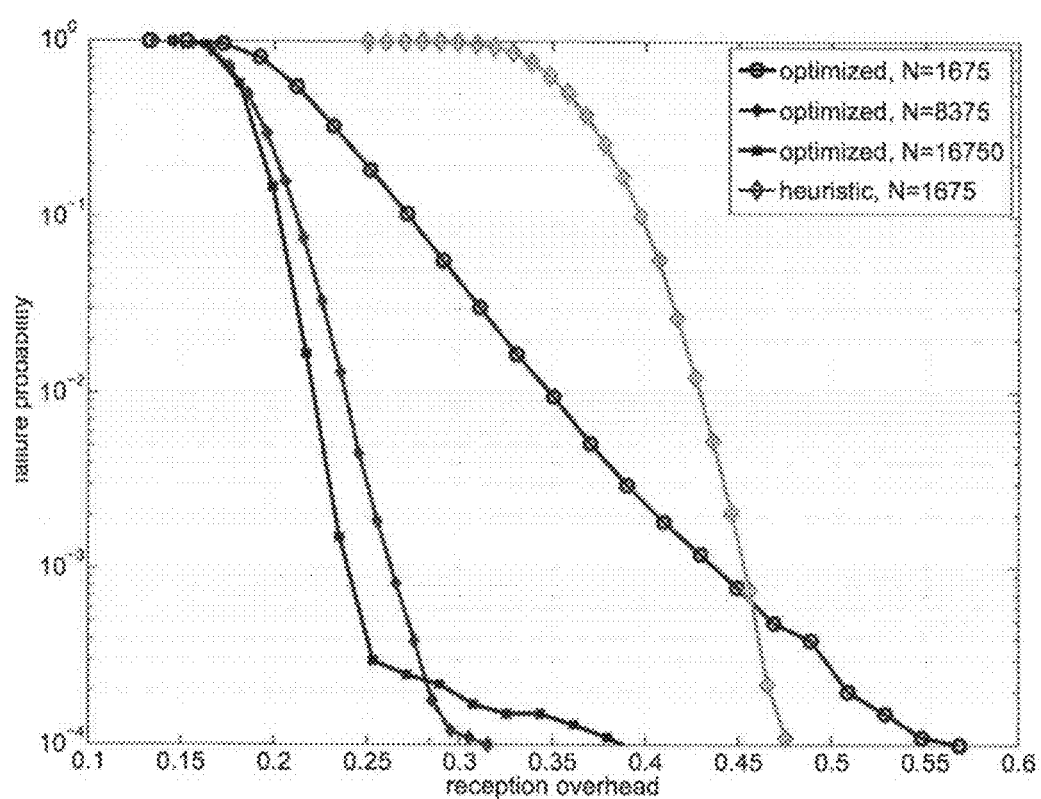
FIG. 5 is a graph comparing failure probability with reception overhead for different Gamma network codes.

As evident from the results, the average achieved reception overhead of $\bar{\epsilon}$=21.37% for the finite-length Gamma network code constructed with the parameters of $C_4$ is higher than the asymptotic reception overhead of $\epsilon$=2.89% as predicted in Table 1. This is partly due to the binary alphabet size used in the simulations and party due to the fact that the block length of the code used in the simulation is bounded. We expect improvements in the performance by increasing the block length of the code. To show this, we have also constructed codes with larger block lengths, namely N=8375 and N=16750. Again g=25 and the rest of the parameters are the same as those of $C_4$ in Table 1. The performance of these codes are depicted in FIG. 5 which show improvement with regard to the code with length N=1675. Table 4 includes the average reception overhead achieved for these constructions. Note that the use of binary alphabet still affects all cases. Methods to improve the overhead performance of these codes under small alphabets will be presented later in this document.

| N | 1675 | 8375 | 16750 |
|---|---|---|---|
| $\bar{\epsilon}$ | 21.37% | 18.27% | 17.56% |

Referring to FIG. 5, a plot of failure probability versus reception overhead for different Gamma network codes is presented. The optimized code is constructed based on the parameters of $C_4$ in Table 1. As the figure shows, the performance is improved by increasing the block size of the encoded packets from 1675 to 16750.

Referring to Table 4, the average overhead for optimized Gamma network codes constructed based on the parameters of $C_4$ with g=25 and q=2 is presented.

As evident from the failure-probability versus overhead performance of the asymptotically optimized Gamma network code with N=1675 in FIG. 5, achieving very low probabilities of failure increases the reception overhead significantly. In other words, the curve is not very steep and there exists an error floor. This is specifically evident when the performance of this code is compared to the heuristically designed Gamma network code which shows essentially no error floor.

The reason for the existence of an error floor for highly optimized Gamma network codes can be described as follows: The decoding evolution chart of highly optimized codes is normally very close to the 45-degree line which makes their opening very narrow, e.g., see FIG. 3. As stated, the evolution chart which is based on (7) and (10), predicts the average performance of asymptotic Gamma network codes. When the convergence condition (10) is satisfied, receiving $r_0 n$ packets from the network is enough to trigger a chain reaction in the decoding such that the asymptotic Gamma network code recovers all of the encoded packets without getting stuck and receiving any more packets from the network.

When finite-length codes are used, however, the performance deviates from the average performance which is expected for the asymptotic regime. As a result, for the finite-length case, the decoder might get stuck several times during the decoding and can only continue after receiving enough packets from the network to form a new full rank generation. Getting stuck in the early stages of decoding when the fraction of recovered packets is small does not increase the reception overhead significantly since the new received packets most likely belong to the non-full rank generations and with high probability they increase the rank of their corresponding generation. However, getting stuck when the fraction of recovered packets is large (equivalent to the upper portion of the decoding evolution chart), normally leads to a significant increase in the reception overhead as most of the new received packets belong to the already full rank generations. The event of getting stuck in the final stages of the decoding happens with low probability but it incurs a large overhead. This is why the error floor exists for these codes in the finite-length cases.

The above discussion suggests that having an asymptotic decoding evolution chart which is widely open at its upper portion leads to codes with smaller error floors since this decreases the probability of getting stuck at points where the fraction of recovered packets is large. Thus for a robust design, asymptotic Gamma network codes can be optimized under an additional constraint to have decoding evolution charts widely open in the upper portion. This can be done by modifying the convergence constraint to $$x < 1 - \frac{\Gamma_g(r_0 + g(1-R)P'(x))}{(g-1)!}, x \in (x_0, 1-\delta_0] \text{ and} \quad (14)$$

$$x < 1 - \frac{\Gamma_g(r_0 + g(1-R)P'(x))}{(g-1)!} - \Delta, x \in (1-\delta_0, 1-\delta'), \quad (15)$$

for some $\Delta>0$ and $x_0<1-\delta_0<1-\delta'$, and modify the minimization problem to $$\min_{R,P(x),x_0,\delta'} \frac{\Gamma_g^{-1}((g-1)!(1-x_0))}{g(1-\delta')R} - 1. \quad (16)$$

-continued subject to: (14) and (15) hold $$\sum_{i=2}^{D} p_i = 1 \quad 0 \le p_i \le 1$$

Notice that the closing point (1−δ') of the decoding evolution chart given by the modified convergence conditions (14) and (15) is used in the robust optimization problem. This closing point is not the closing point of the true asymptotic evolution chart of the decoding because of the margin Δ. The true asymptotic convergence condition and evolution chart are still given by (10). After solving (16), the pre-code rate is found to be R'=1−δ' and the overhead of this concatenation will then be $$\varepsilon = \frac{\Gamma_g^{-1}((g-1)!(1-x_0))}{g(1-\delta')R} - 1.$$

Figure 6:
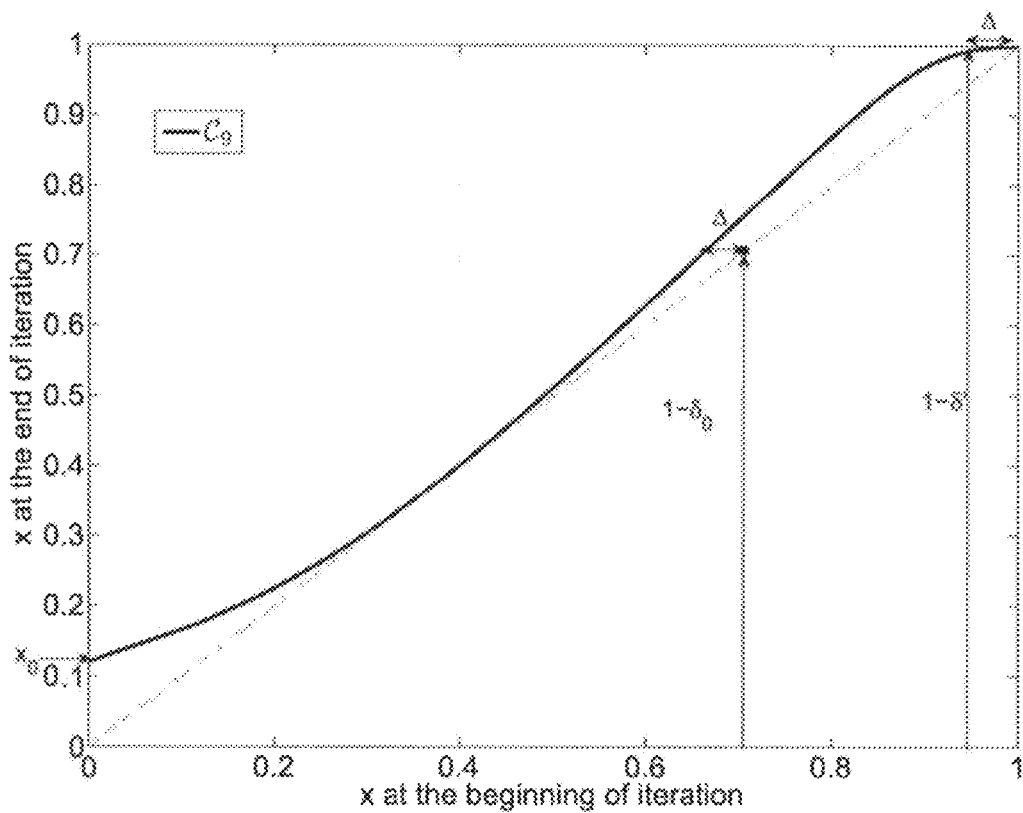
FIG. 6 is a decoding evolution chart for a robust optimized Gamma network code.
Figure 7:
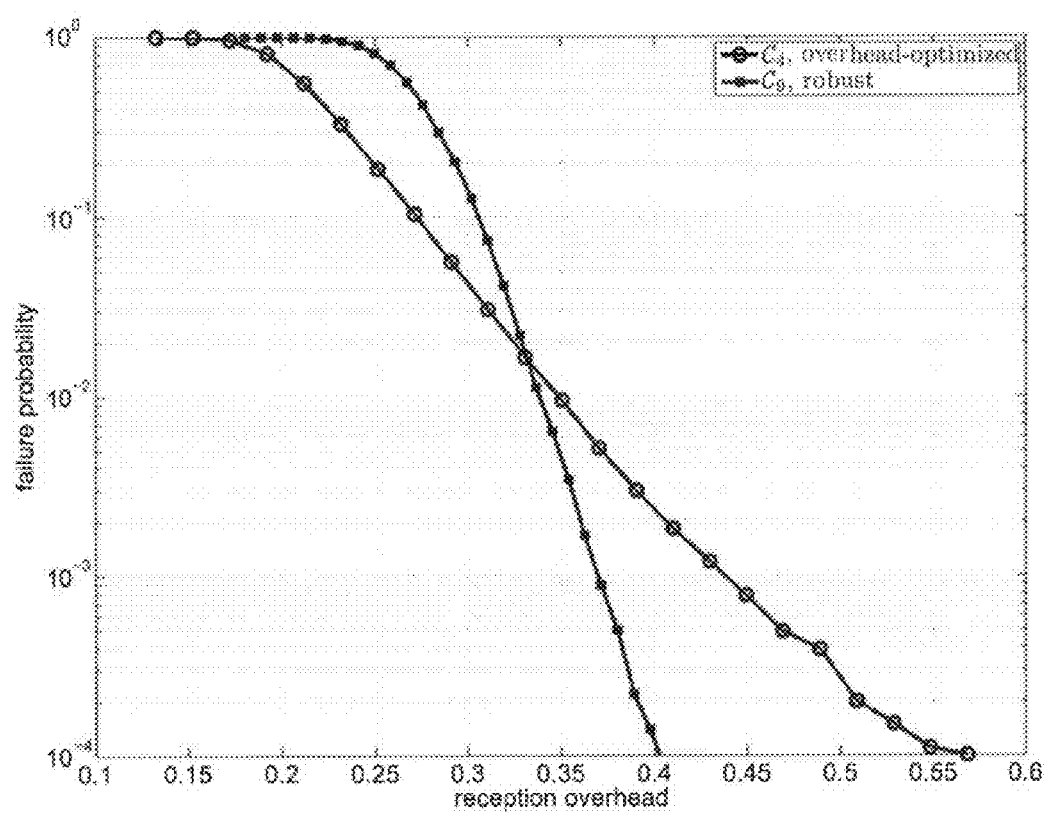
FIG. 7 is a graph comparing failure probability with reception overhead for a Gamma network code optimized for minimum average reception overhead and for a robust Gamma network code.

The parameters of such robust code designed by setting Δ=0.05, 1−δ$_0$=0.7, and solving (16) are given in Table 5. FIG. 6 depicts the decoding evolution chart of this code. The average reception overhead achieved for a finite-length construction of this code with R'=0.94 and N=1675 is $\bar{\varepsilon}$=26.83%. The performance is also depicted in FIG. 7 where it is shown that the error floor can be decreased significantly using the above robust optimization method. This is achieved at the expense of a slight increase in the average reception overhead.

| | $C_9$ |
|---|---|
| $p_2$ | 0.5582 |
| $p_3$ | 0.2983 |
| $p_5$ | 0.0014 |
| $p_6$ | 0.0004 |
| $p_7$ | 0.0016 |
| $p_8$ | 0.0084 |
| $p_9$ | 0.0081 |
| $p_{10}$ | 0.0053 |
| $p_{11}$ | 0.0083 |
| $p_{12}$ | 0.0556 |
| $p_{13}$ | 0.0302 |
| $p_{14}$ | 0.0161 |
| $p_{15}$ | 0.0080 |
| g | 25 |
| $x_0$ | 0.1202 |
| R | 0.7186 |
| 1 − δ' | 0.9411 |
| 1 − Δ | 0.7000 |
| Δ | 0.0500 |
| ε | 14.11% |

Referring to Table 5, the parameters for a robust optimized code designed by solving (16) and assuming D=15 are presented.

Referring to FIG. 6, a decoding evolution chart for the robust optimized Gamma network code $C_9$ with parameters D=15, Δ$_x$=0.05, and Δ$_0$=0.7 is presented along with the parameters for those in Table 2. Notice that this code has a wide opening at the upper portion of its evolution chart.

Referring to FIG. 7, presented is a plot of failure probability versus reception overhead for $C_4$, a network Gamma code optimized for minimum average reception overhead as well as for $C_9$, a robust Gamma network code designed based on the above method whose parameters are reported in Table 5. It is clear that the error floor is significantly improved under the robust design compared to the optimized design of $C_4$.

It was stated above that the check nodes of the outer code impose parity-check constraints on the dense linear combinations of all of the packets of the connected generations. This is different from how a check node of a conventional linear code imposes constraints directly on the connected packets. Thus, the encoding process of the outer code in Gamma network codes is different from conventional linear codes.

To achieve linear encoding complexity per block length, encoding the outer coded packets can be done as follows: First, it is assumed that we have an outer code of rate R=K/N with check degree distribution P(x) and generation size g. The following steps are then taken:

1. We construct an instance of the ensemble of Tanner graphs specified by P(x) which connects n=N/g generations to N−K check nodes. We then call the number of check nodes connected to each generation $G_i$ the degree of that generation $d_{G_i}$.

2. The n generations are sorted based on their degrees in a descending order such that $d_{G_i} \ge d_{G_{i+1}}$, 1≤i≤n−1.

3. The K pre-coded packets constitute K outer coded packets as in a systematic code. These packets are distributed into the n generations based on the following rules:
 (a) Generation i receives $m_i$=g−[$d_{G_i}/\bar{d}$] where $\bar{d}$ is the empirical average degree of the check nodes and [•] denotes rounding to the nearest integer.
 (b) It is ensured that $\sum_{i=1}^{n} m_i = K$.

4. Generation $G_i$ now contains $m_i$ packets $\{u_1^i, \ldots, u_{m_i}^i\}$. Set i=1.

5. For $G_i$, we select g−$m_i$ number of check nodes among the $d_i$ check nodes connected to i with the highest check degrees. The set of these check nodes is denoted by M($G_i$).

6. We generate g−$m_i$ parity packets $\{u_{m_i+1}^i, \ldots, u_g^i\}$ as $$u_j^i = \sum_{k \in N(c)} \sum_{l=1}^{n_k} \alpha_l^k u_l^k, \quad j \in \{m_{i+1}, \ldots, g\} \tag{17}$$

where c∈M($G_i$), N(c) denotes the set of generations connected to c, $n_{G_k}$ denotes the number of packets currently available in $G_k$, and α are random coefficients from GF(q).

7. If i=n stop. Else set i:=i+1 and go to step 5.

This process ensures that the number of packets which participate in the random linear combinations are maximized.

It is also possible to impose parity-check constraints on the outer coded packets as in a conventional linear code instead of their dense linear combination. In this case, $p_i$ in P(x)=Σ$p_i x^i$ represents the probability that any given check node be connected to i outer coded packets. The decoding process for such a code should be modified since any outer code's check node which is reduced to degree one, similar to the pre-codes' check nodes, now recovers an outer coded packet instead of adding a dense linear equation to its corresponding generation. If the new to-be-recovered packet has not already been decoded, it can now be removed from the linear equation system of its belonging generation. Since the linear equation system has dense coefficient vectors, rank will be preserved with high probability and with less number of unknowns now there exists a possibility that the equation system can be solved.

In the analysis of the outer code portion of the invention discussed above, we assumed that every check node reduced to degree one increases the rank of its corresponding generation by one. This assumption is not valid when check nodes are imposed on outer coded packets since a reduced degree one check node may be connected to an already recovered packet. Thus, performance of such scheme will be upper bounded by the outer code scheme above.

Nevertheless, using packet-level check nodes for the outer code provides some opportunities in the decoding which can improve its performance when small alphabet sizes are used. Small alphabet sizes such as binary are attractive for practical implementations since they reduce the complexity of operations. We stated that during decoding, Gaussian elimination is performed on the linear equation system of each generation. If any equation system becomes full rank, all of the encoded packets which belong to that generation are recovered. A full rank generation of size g requires at least g equations or received packets which belong to that generation. When the alphabet size is small, however, a few packets can be recovered in each generation even when the number of received packets which belong to that generation is less than g. This can be done by running Gauss-Jordan elimination on the equation system and transforming its matrix of coefficients to a reduced row-echelon form. When the alphabet size is small, there is a possibility of having rows with only one non-zero element in the reduced row-echelon matrix. For example, when q=2 and g=25, about 3 packets can be recovered on average when the number of received packets is only 22. We also encounter rows with one non-zero element when removing packets recovered by a degree-one check node from the equation system. These new recovered packets can then trigger a chain reaction by reducing the degrees of their neighboring check nodes and recovering even more packets.

Figure 8:
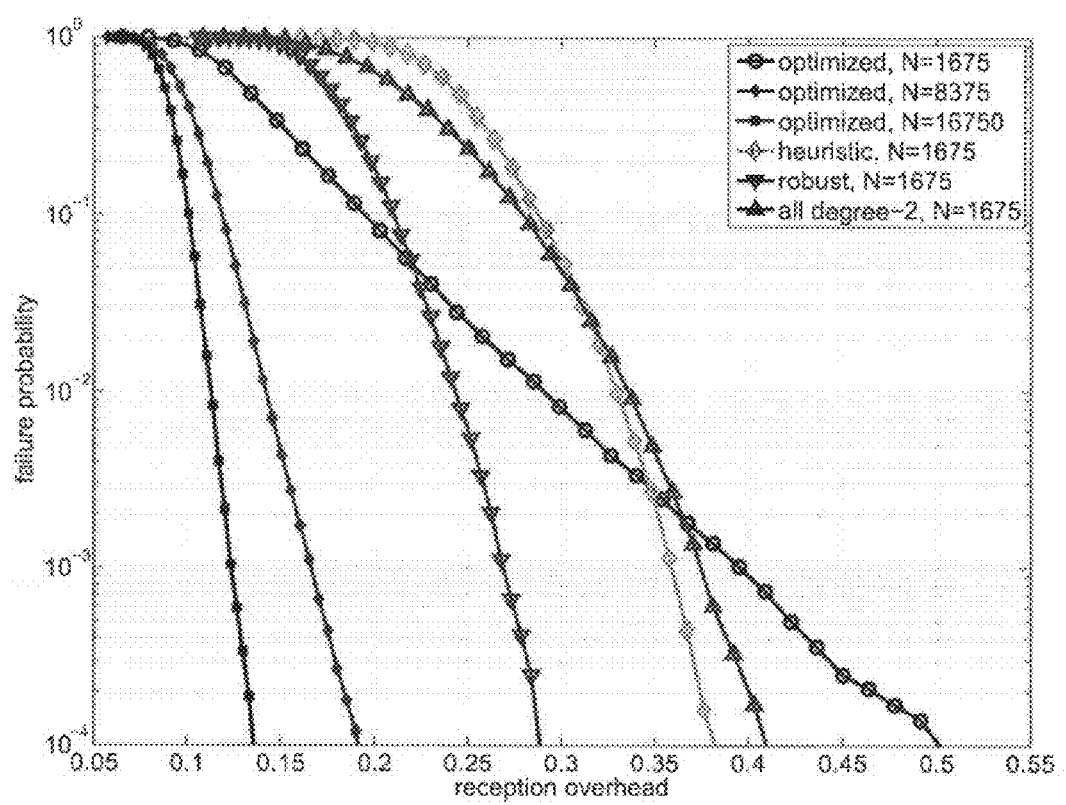
FIG. 8 is a graph of failure probability vs. reception overhead for different Gamma network codes with packet-level outer code check nodes.

Given the parameters of the optimized Gamma network code $C_4$, we have constructed finite-length Gamma network codes with q=2 whose outer code have packet-level check nodes. The pre-codes are LDPC codes of rate R'=0.97. Table 6 shows the average reception overhead achieved under these codes by using the above-mentioned packet-recovery opportunities. FIG. 8 also shows the performance of various optimized codes with packet-level outer code check nodes. As the figure shows, significant improvement can be seen in the failure probability-overhead tradeoff under q=2 using packet-level check nodes and the decoding method described in this section. The figure also includes a finite-length Gamma network code of length N=1674 with all degree-2 check nodes constructed based on the check degree distribution of $C_1$ in Table 1 with an LDPC pre-code of rate R'=0.92. The average reception overhead achieved under this code is $\bar{\epsilon}$=21.48%. Random outer codes with all degree-2 check degree distribution are equivalent to repetition codes, which are as discussed earlier the alternative description of the overlapping SRLNC scheme. In this view, $C_1$ is indeed the optimized design for a randomly distributed overlapping scheme for SRLNC, which is comparable to the design of Random Annex codes. Thus, by comparing the performance of $C_1$ with the other Gamma network codes, we can measure how much improvement can be achieved in practice by using a Gamma network code compared to overlapping SLRNC.

| N | 1675 | 8375 | 16750 |
|---|---|---|---|
| $\bar{\epsilon}$ | 13.55% | 9.65% | 8.73% |

Referring to Table 6, provided are the average overhead values for optimized Gamma network codes constructed based on the parameters of $C_4$ with g=25 and q=2. The check nodes of the outer code impose parity-check equations directly on the packets.

Referring to FIG. 8, provided is a plot of failure probability versus reception overhead for different Gamma network codes with packet-level outer code check nodes. The optimized codes are constructed based on the parameters of $C_4$ in Table 1. The robust Gamma network code is designed based on the method described in the invention with parameters reported in Table 5 (for $C_9$). The plot in FIG. 8 also includes the performance for a Gamma network code optimized with all degree-2 check nodes ($C_1$ in Table 1) which represents an optimized overlapping SRLNC.

Figure 9:
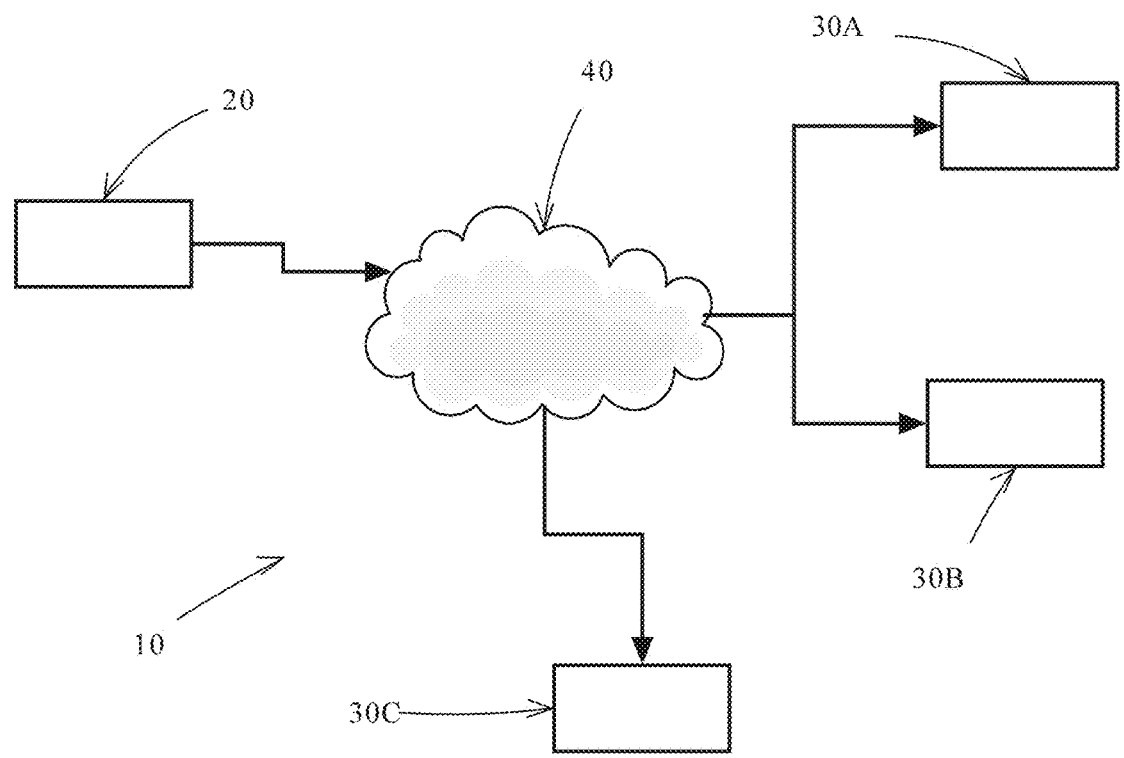
FIG. 9 is a block diagram of an environment in which the invention may be practiced.

Referring to FIG. 9, a block diagram of an environment in which the invention may be used is illustrated. The environment 10 has a source 20 from which data packets are sent to a number of destinations 30A, 30B, 30C. The data packets are sent by way of a communications network 40. It should be noted that the environment in FIG. 9 uses a multicast model where the single source 20 transmits data to multiple destinations 30A, 30B, 30C. A non-multicast model may, of course, be used where a source transmits data packets to a single destination.

It should be noted that the source 20 may be a computer server connected to a network 40 or any other suitable computing or data processing device capable of communicating with other computing devices. Similarly, the destinations 30A-30C may also be any computing or data processing devices that is capable of communicating with other data processing devices by way of the network.

Figure 10:
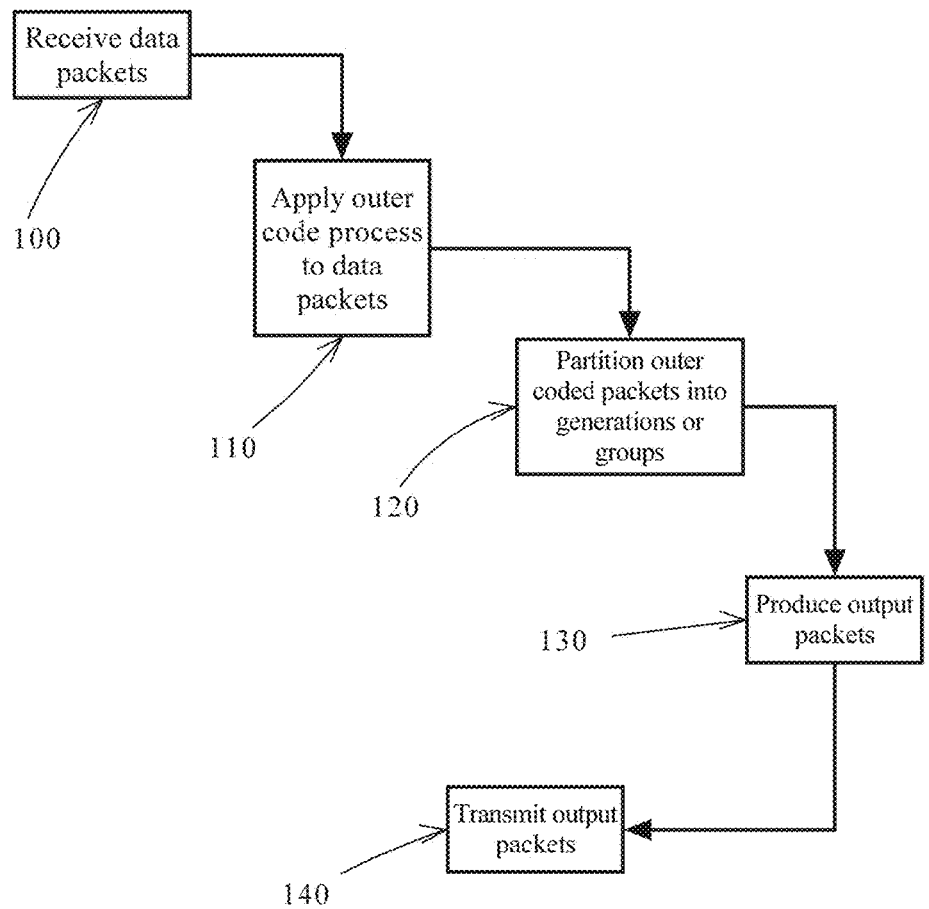
FIG. 10 is a flowchart detailing the steps in a method according to one aspect of the invention.

Referring to FIG. 10, a flowchart detailing the high-level steps in a method according to the invention is illustrated. The generalized method in FIG. 10 is for the encoding of data packets prior to transmitting the encoded data packets to the network.

The method begins at step 100, that of receiving data packets for encoding. Step 110 applies an outer code process to the data packets. The outer coded data packets are then partitioned into different generations or groups (step 120). The partitioned outer coded data packets are then used to produce output packets (step 130). As noted above, these output packets are linear combinations of the outer coded data packets. The output packets are then transmitted to the destinations (step 140).

Figure 11:
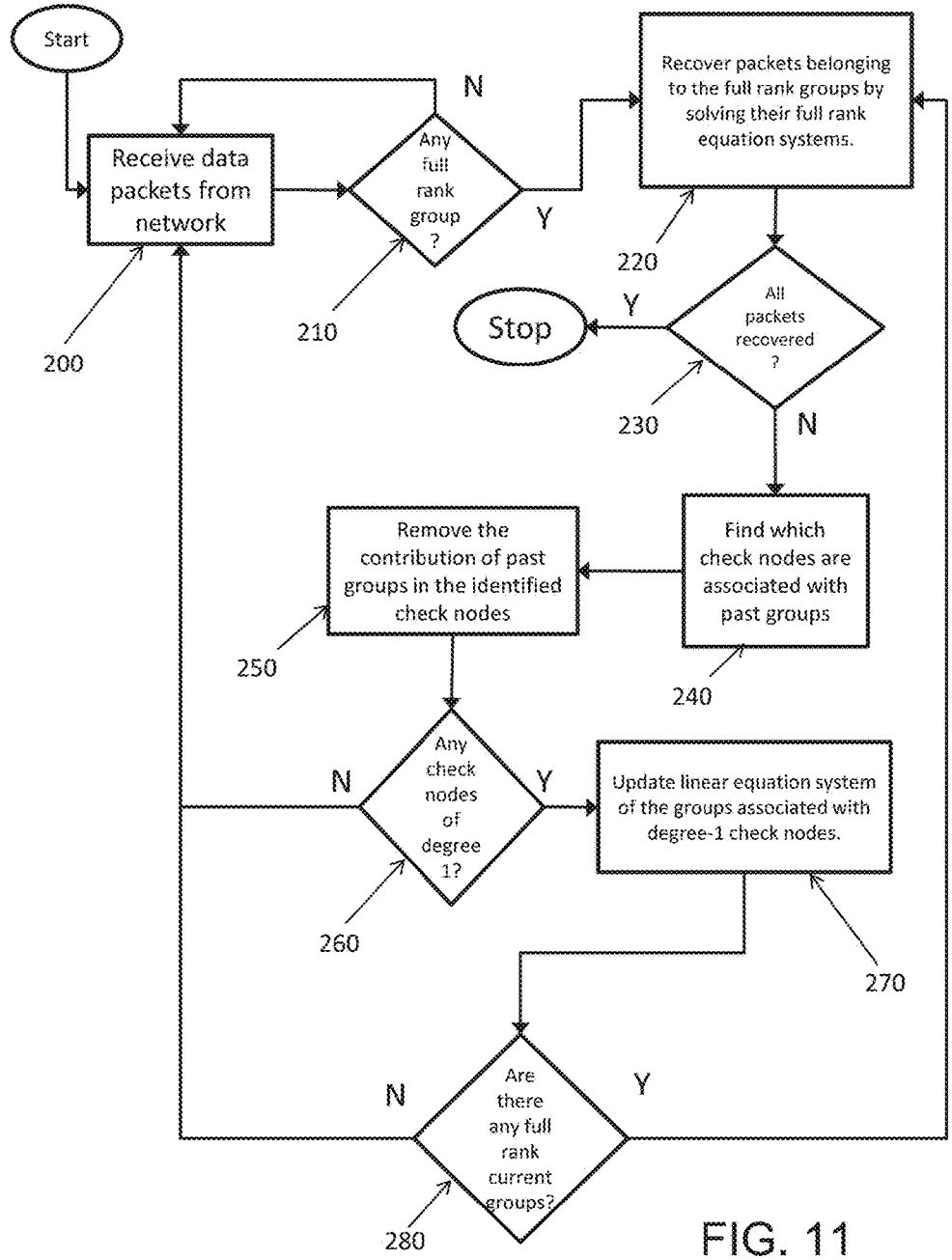
FIG. 11 is a flowchart detailing the steps in a method according to another aspect of the invention.

Referring to FIG. 11, a flowchart detailing the steps in a method according to another aspect of the invention is illustrated. For the method in FIG. 11, the method relates to the decoding of data packets received from the network. These data packets were encoded using another aspect of the invention.

The process in FIG. 11 starts with the reception of encoded data packets from the network (step 200). Decision 210 determines of enough encoded data packets have been received to construct a full rank equation system for at least one group. If an insufficient number of data packets have been received, the logic flow continues to step 200 as more data packets are received. Step 220 recovers packets belonging to the full rank groups by solving the linear equation system. These recovered packets are called past packets afterwards. Step 230 then checks to see if all packets are recovered. If all packets are recovered, the decoding process stops successfully. If not, it goes to the next step. Step 240 then determines which check nodes are associated with past generations or groups and with past full rank linear equation systems. The contribution of data packets associated with the check nodes that are associated with past generations are then removed from the check nodes (step 250). Step 260 then checks to see if the degree of any check node is reduced to one. If no such check node can be found, logic flow continues to step 200 to receive more packets. If there are check nodes with degree one (i.e. degree-one check nodes), the degree-one check nodes update the relevant linear equation system or systems of the relevant connected group or groups by adding one linear equation in terms of the packets of the said group or groups to the equation system or systems of the said group or groups (step 270). The updated groups are called current groups. Decision 280 then determines if any of the updated linear equation system of the current groups is full rank. If no groups is full rank then logic flow goes back to step 200. If at least one full rank group is found then logic flow goes to step 220 to recover the packets and continue the decoding process.

Figure 12:
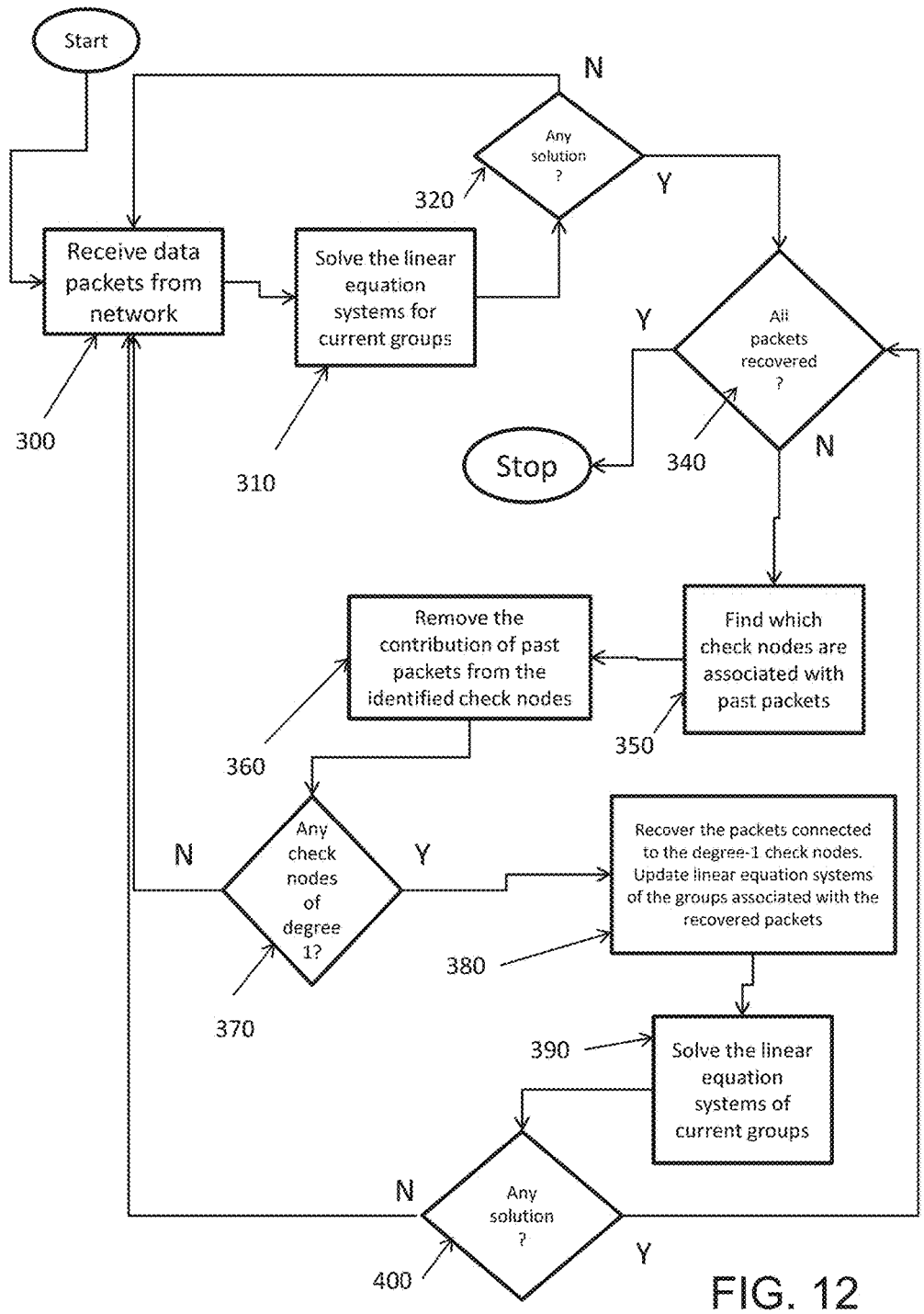
FIG. 12 is a flowchart detailing the steps in another method according to a further aspect of the invention.

Referring to FIG. 12, a flowchart detailing the steps in a method according to another aspect of the invention is illustrated. For the method in FIG. 12, the method relates to an alternative method of decoding data packets received from the network. These data packets were encoded using another aspect of the invention.

The process in FIG. 12 starts with the reception of encoded data packets from the network (step 300). Step 310 tries to solve the linear equation system of the groups associated with received packets. Decision 320 determines if enough encoded data packets have been received such that at least one packet could be recovered by solving the equation systems. It should be noted that an equation system need not be full rank to have a solution. If an insufficient number of data packets have been received to arrive at a solution, the logic flow returns to step 300 as more data packets are received. If a solution is possible, then from decision 320, step 340 then checks to see if all packets have been recovered. If all packets are recovered, the decoding process stops successfully. If not, the logic proceeds to step 350. This step finds out which check nodes are associated with past packets (i.e. packets which have already been decoded/data extracted from them). Once these check nodes are found, the contribution of the past packets associated with these check nodes are then removed from the said check nodes (step 360). Step 360 can therefore lower or reduce the degree of some of the check nodes. In step 370, a check is made to determine if the degree of any check node has been reduced to one. If no such check node can be found, the logic flow continues to step 300 to receive more packets. If a degree-1 check node (i.e. a check node with degree one) is found, the packets associated with that degree-1 check node are then recovered (i.e. the content of these packets are extracted). Along with the recovery of the packet contents, the linear equation systems of the groups associated with the recovered packets are updated (step 380). These recovered packets can be referred to as past packets. The update of the linear equation systems for the groups associated with the recovered packets may be accomplished by removing the recovered packets from the systems. These updated groups can thus be called current groups. Once the relevant linear equation systems have been updated, the linear equation systems of the current groups are then solved (step 390). Decision 400 determines if any solution exists for these systems. If no solution can be found, logic flow returns to step 300 to receive more packets. If a solution can be found, packets are thus recovered and the logic flow returns to step 340 to determine if all the packets have been recovered.

It should be noted that the description above describes two main options for decoding encoded packets. In the first decoding method, check nodes impose equations on linear combinations of packets from different generations. In the second decoding method (described above in relation to using small alphabet sizes), check nodes impose equations directly on the packets and not on the linear combination of packets.

A generalized decoding method can be extracted from the commonalities between these two decoding options. In the generalized decoding method, packets are received from the network until a specific condition is satisfied. Once the condition is satisfied, packets are recovered and thereby reduce the degree of the connected check nodes. A check is then made to determine if any of the check nodes have an updated degree equal to one. If no degree-one check nodes are found, more packets are received and the method iterates. If at least one degree-one check node is found, the linear equation systems for the generations connected to the degree-one check nodes are updated. The specific condition is again checked and the process iterates until an exit condition is satisfied. The exit condition may be the recovery or decoding of all the packets.

While the above details the common aspects of the two decoding processes, the differences between these processes are also marked. As an example, the specific condition used by the two processes are different. In the first process, the specific condition is whether ay of the groups or generations of packets has an associated linear equation system which is full rank. If an equation system has become full rank, then all the packets associated with that system is recovered.

For the second decoding process, it should be noted that a full rank linear equation system is not required to arrive at a partial solution to the system. By using Gaussian elimination, a partial solution might be found and some packets may be recovered, even without a full rank linear equation system. If a packet is recovered, this affects the degree of the check nodes associated directly with the recovered packet. A check is then made to determine if any of the check nodes have a resulting degree equal to one. If such check nodes are available, the linear equation systems associated with the degree one check nodes can then be updated accordingly.

It should be noted that the methods for updating linear equation systems also differ for the two decoding methods. For the first decoding process, a degree-one check node adds a linear equation to the linear equation system associated with the degree-one check node. For the second decoding process, a degree-one check node directly recovers the packet contents of the packet connected to the check node. In doing so, one of the unknowns/variables in the associated linear equation systems is removed/replaced with a known quantity.

As noted above, a partial solution (i.e. recovery of some but not all packets) of a linear equation system is possible even if the equation system is not full rank. A partial recovery/solution can assist in the eventual full solution of the linear equation system. Note that to check for full rank or to determine if any subset of unknowns could be recovered, Gaussian elimination may be used.

It should also be noted that the network by which encoded packets are transported from a source node to a destination node may be any type of network. The nodes internal to this network may be simple store and forward nodes or they may be more complex nodes that similarly use intermediate encoding or recoding of packets being transported. At each intermediate node, this recoding may be done by forming new packets as random linear combinations of received packets in each generation. This new recoded packet is then transmitted by the intermediate node along with the new packet's corresponding coefficient vector and generation index to the next hop in the network.

The embodiments of the invention may be executed by a computer processor or similar device programmed in the manner of method steps, or may be executed by an electronic system which is provided with means for executing these steps. Similarly, an electronic memory means such as computer diskettes, CD-ROMs, Random Access Memory (RAM), Read Only Memory (ROM) or similar computer software storage media known in the art, may be programmed to execute such method steps. As well, electronic signals representing these method steps may also be transmitted via a communication network.

Embodiments of the invention may be implemented in any conventional computer programming language. For example, preferred embodiments may be implemented in a procedural programming language (e.g. "C") or an object-oriented language (e.g. "C++", "java", "PHP", "PYTHON" or "C#"). Alternative embodiments of the invention may be implemented as pre-programmed hardware elements, other related components, or as a combination of hardware and software components.

Embodiments can be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or electrical communications lines) or a medium implemented with wireless techniques (e.g., microwave, infrared or other transmission techniques). The series of computer instructions embodies all or part of the functionality previously described herein. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink-wrapped software), preloaded with a computer system (e.g., on system ROM or fixed disk), or distributed from a server over a network (e.g., the Internet or World Wide Web). Of course, some embodiments of the invention may be implemented as a combination of both software (e.g., a computer program product) and hardware. Still other embodiments of the invention may be implemented as entirely hardware, or entirely software (e.g., a computer program product).

A person understanding this invention may now conceive of alternative structures and embodiments or variations of the above all of which are intended to fall within the scope of the invention as defined in the claims that follow.

We claim:

1. A method for encoding data packets at a source node prior to transmission to a destination node by way of a computer network, the method comprising:
   a) applying by a processor a linear outer code process to a plurality of data packets to result in a plurality of outer coded packets;
   b) partitioning by a processor said plurality of outer coded packets to result in a plurality of groups of outer coded packets, each group of outer coded packets having an equal number of outer coded packets and each group of outer coded packets having at least 2 outer coded packets;
   c) producing by a processor a plurality of output packets from said groups of outer coded packets, each output packet being a linear combination of outer coded packets from a specific one of said groups of outer coded packets from step b), each output packet being associated with a generation index, said generation index being associated with said specific one of said groups of outer coded packets from step b), each output packet being associated with a specific coefficient vector having elements selected from a finite field, said elements of said specific coefficient vector being coefficients for said linear combination of outer coded packets for said output packet;
   wherein
   each output packet is transmitted to said destination by way of said computer network along with said output packet's corresponding coefficient vector and said output packet's corresponding generation index.

2. A method according to claim 1 wherein, prior to step a), a pre-code process is applied to said plurality of data packets to result in a plurality of pre-coded data packets, said pre-coded data packets being used in step a) as said data packets.

3. A method according to claim 2 wherein said pre-code process is a high-rate right-regular low-density parity-check code for use in a binary erasure channel model.

4. A method according to claim 1 wherein step a) and b) are jointly executed by:
   ab1) sorting said groups based on a degree of said group in descending order, an order of a group being equal to a number of check nodes connected to said group;
   ab2) distributing said plurality of pre-coded packets across said groups of outer coded packets such that each group receives a number of pre-coded packets based on a degree of said group and an average degree of check nodes connected to all groups;
   ab3) generating a plurality of parity packets, each parity packet having random coefficients selected from said finite field.

5. A method according to claim 1 wherein said output packets are decoded at said destination using a method of decoding encoded data packets, the method comprising:
   aa) receiving by a processor a plurality of encoded data packets, each data packet being previously encoded such that said data packet is associated with at least one group of data packets, each data packet being a linear combination of outer coded packets from a specific group of outer coded packets;
   bb) determining by said processor if a specific condition has been satisfied, said specific condition relating to a linear equation system based on received packets;
   cc) in the event said specific condition has been satisfied, recovering by said processor contents of at least one outer coded packet;
   dd) reducing by said processor a degree of at least one check node associated with said group of data packets;
   ee) determining by said processor if any of said at least one check node associated with said group of data packets has a degree equal to one;
   ff) in the event at least one of said at least one check node associated with said group of data packets has a degree equal to one, updating by said processor linear equation systems for groups of packets associated with said at least one check node having a degree equal to one;

gg) repeating steps aa)—ff) until an exit condition is satisfied.

6. A method for decoding encoded data packets, the method comprising:
   a) receiving by a processor a plurality of encoded data packets, each data packet being previously encoded such that said data packet is associated with at least one group of data packets, each data packet being a linear combination of outer coded packets from a specific group of outer coded packets, said processor receiving enough encoded data packets to recover at least one outer coded packet by solving a linear equation system formed for a current group of data packets;
   b) determining if all encoded packets have been recovered and terminating said method if all encoded packets have been recovered;
   c) determining which check nodes are connected to past packets, said past packets being recently recovered packets;
   d) removing data packets connected to check nodes connected to past packets;
   e) recovering packets associated with degree-one check nodes, degree-one check nodes being check nodes having a degree equal to one;
   f) updating linear equation systems for groups associated with degree-one check nodes by removing recovered packets from said linear equation systems;
   g) solving linear equation systems which were updated in step f) to recover contents of packets associated with said linear equation systems.

7. A method according to claim 6 wherein said data packets are encoded using a method for encoding data packets at a source node prior to transmission to a destination node by way of a computer network, the method comprising:
   a1) applying by a processor a linear outer code process to a plurality of input data packets to result in a plurality of outer coded packets;
   b1) partitioning by a processor said plurality of outer coded packets to result in a plurality of groups of outer coded packets, each group of outer coded packets having an equal number of outer coded packets and each group of outer coded packets having at least 2 outer coded packets;
   c1) producing by a processor a plurality of output packets from said groups of outer coded packets, each output packet being a linear combination of outer coded packets from a specific one of said groups of outer coded packets from step b1), each output packet being associated with a generation index, said generation index being associated with said specific one of said groups of outer coded packets from step b1), each output packet being associated with a specific coefficient vector having elements selected from a finite field, said elements of said specific coefficient vector being coefficients for said linear combination of outer coded packets for said output packet;
   wherein
   each output packet is transmitted to said destination by way of said computer network along with said output packet's corresponding coefficient vector and said output packet's corresponding generation index;
   said output packets are said encoded data packets referred to in claim 6.

8. A method according to claim 6 wherein said full rank linear equation system is solved using Gaussian elimination.

9. Non-transitory computer readable media having encoded thereon computer readable and computer executable instructions which, when executed, implements a method for encoding data packets at a source node prior to transmission to a destination node by way of a computer network, the method comprising:
   a) applying by a processor a linear outer code process to a plurality of data packets to result in a plurality of outer coded packets;
   b) partitioning by a processor said plurality of outer coded packets to result in a plurality of groups of outer coded packets, each group of outer coded packets having an equal number of outer coded packets and each group of outer coded packets having at least 2 outer coded packets;
   c) producing by a processor a plurality of output packets from said groups of outer coded packets, each output packet being a linear combination of outer coded packets from a specific one of said groups of outer coded packets from step b), each output packet being associated with a generation index, said generation index being associated with said specific one of said groups of outer coded packets from step b), each output packet being associated with a specific coefficient vector having elements selected from a finite field, said elements of said specific coefficient vector being coefficients for said linear combination of outer coded packets for said output packet;
   wherein
   each output packet is transmitted to said destination by way of said computer network along with said output packet's corresponding coefficient vector and said output packet's corresponding generation index.

10. A method for decoding encoded data packets, the method comprising:
   a) receiving by a processor a plurality of encoded data packets, each data packet being previously encoded such that said data packet is associated with at least one group of data packets, each data packet being a linear combination of outer coded packets from a specific group of outer coded packets;
   b) determining by said processor if a specific condition has been satisfied, said specific condition relating to a linear equation system based on received packets;
   c) in the event said specific condition has been satisfied, recovering by said processor contents of at least one outer coded packet;
   d) reducing by said processor a degree of at least one check node associated with said group of data packets;
   e) determining by said processor if any of said at least one check node associated with said group of data packets has a degree equal to one;
   f) in the event at least one of said at least one check node associated with said group of data packets has a degree equal to one, updating by said processor linear equation systems for groups of packets associated with said at least one check node having a degree equal to one;
   g) repeating steps a)-f) until an exit condition is satisfied.

11. A method according to claim 10 wherein said specific condition comprises determining by said processor if a linear equation system associated with a group of packets is a full rank linear equation system.

12. A method according to claim 10 wherein said specific condition comprises determining by said processor if one of said linear equation systems associated with at least one group of packets is solvable to yield contents of at least one packet.

13. A method according to claim 10 wherein said exit condition is recovery of contents for all received data packets.

* * * * *